United States Patent [19]
Young

[11] Patent Number: 5,812,417
[45] Date of Patent: Sep. 22, 1998

[54] METHOD AND APPARATUS UTILIZING DATAPATH LINE MINIMIZATION TO GENERATE DATAPATH FLOOR PLAN FOR INTEGRATED CIRCUIT

[75] Inventor: Whu-Ming Young, Palo Alto, Calif.

[73] Assignee: National Semiconductor Corporation, Santa Clara, Calif.

[21] Appl. No.: 668,653

[22] Filed: Jun. 24, 1996

[51] Int. Cl.$^6$ .................................................. G06F 17/50
[52] U.S. Cl. ...................... 364/491; 364/488; 364/489; 364/490
[58] Field of Search .................. 364/488–491, 364/578

[56] References Cited

U.S. PATENT DOCUMENTS

| | | | |
|---|---|---|---|
| 5,426,591 | 6/1995 | Ginetti et al. | 364/489 |
| 5,491,640 | 2/1996 | Sharma et al. | 364/488 |
| 5,519,627 | 5/1996 | Mahmood et al. | 364/488 |

OTHER PUBLICATIONS

Buddi et al. ("Layout synthesis for datapath designs", IEEE Comput. Soc. Press, Proceedings EURO–DAC '95: European Design Automation Conference with EURO–VHDL, 18 Sep. 1995, pp.86–90).

Choi et al. ("Exploration of area and performance optimized datapath design using realistic cost metrics", IEEE, 1995 IEEE Symposium on Circuits and Systems, 28 Apr. 1995, pp. 1049–1052).

Safir et al. ("A floorplanner driven by structural and timing constraints", IEEE, 1994 IEEE International Symposium on Circuits and Systems, 30 May 1994, pp. 157–160).

Cai et al, "A Data Path Layout Assembler for High Performance DSP Circuits," *27th ACM/IEEE Design Automation Conf.*, Paper 18.1, 1990, pp. 306–311.

Cohen et al, "Track Assignment in the Pathway Datapath Layout Assembler," *91 IEEE Int. Conf. Computer Aided Design*, 1991, pp. 102–105.

Trick et al, "LASSIE: Structure to Layout for Behavior Synthesis Tools," *26th ACM/IEEE Design Automation Conf.*, Paper 8.1, 1989, pp. 104–109.

Weste et al, *Principles of CMOS VLSI Design, A Systems Perspective* (2nd ed., Addison–Wesley Publishing Co.), 1985, pp. 21–39.

"Verilog–XL® Tutorial," Cadence Design Systems, Mar. 1991, pp. 1–68.

*Primary Examiner*—Emanuel Todd Voeltz
*Assistant Examiner*—Phallaka Kik
*Attorney, Agent, or Firm*—Skjerven, Morrill, MacPherson, Franklin & Friel LLP; Ronald J. Meetin

[57] ABSTRACT

A technique for configuring multiple datapath components into a one-dimensional datapath sequence to form a datapath module that provides a specified function entails counting the number of instances in which a datapath line non-redundantly passes a datapath component in each of a plurality of different one-dimensional configurations of the datapath components for which ports of the datapath components and, as necessary, the datapath module are interconnected through datapath lines to provide the specified function. The datapath components are then placed in a particular one of the one-dimensional configurations for which the number of instances counted during the counting operation is a minimum, subject to any timing constraint. Before performing the counting and placing operations, a special procedure is preferably employed to reduce the number of configurations considered during the counting operation. The special procedure entails determining whether there is any datapath component having a single input port and a single output port. If so, an appropriate interconnection of each such single-input/single-output datapath component to another datapath component is established to form a larger datapath component, thereby reducing the number of non-interconnected datapath components. The present technique can be implemented manually and/or with apparatus such as a computer.

56 Claims, 12 Drawing Sheets

SINGLE-INPUT/SINGLE-OUTPUT
DATAPATH COMPONENT 40

Fig. 4a

PRIMITIVE DATAPATH CELL

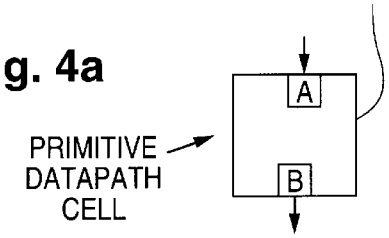

MULTIPLE-INPUT/SINGLE-OUTPUT
DATAPATH COMPONENT 41

Fig. 4b

PRIMITIVE DATAPATH CELL

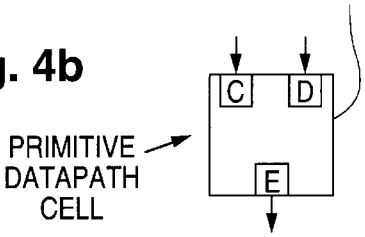

SINGLE-INPUT/SINGLE-OUTPUT
DATAPATH COMPONENT 42

Fig. 4c

DATAPATH MACROCELL, GROUP, OR MODULE

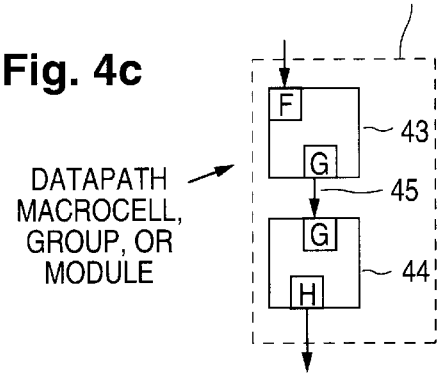

MULTIPLE-INPUT/SINGLE-OUTPUT
DATAPATH COMPONENT 46

Fig. 4d

DATAPATH MACROCELL, GROUP, OR MODULE

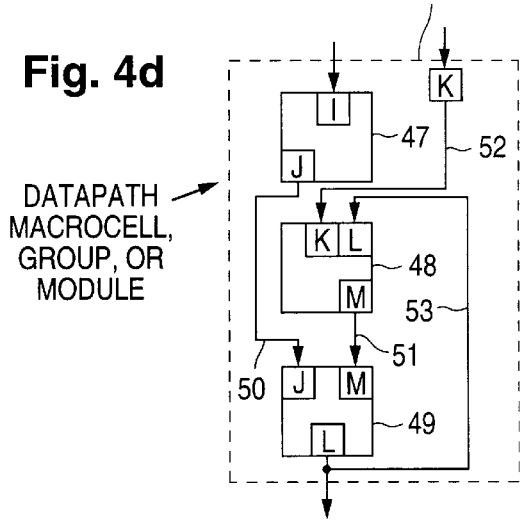

MULTIPLE-INPUT/SINGLE-OUTPUT
DATAPATH COMPONENT 54

Fig. 4e

DATAPATH GROUP OR MODULE

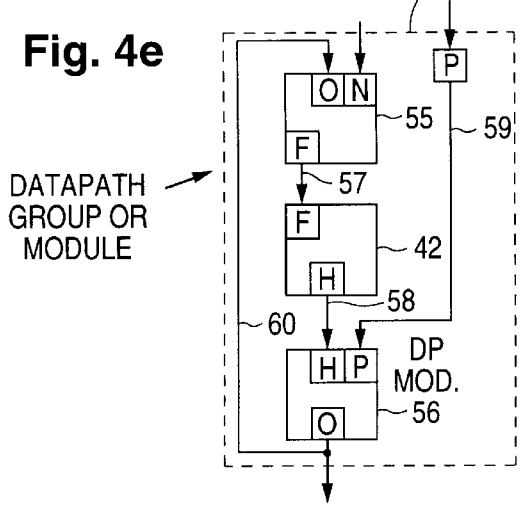

MULTIPLE-INPUT/MULTIPLE-OUTPUT
DATAPATH COMPONENT 61

Fig. 4f

DATAPATH MODULE

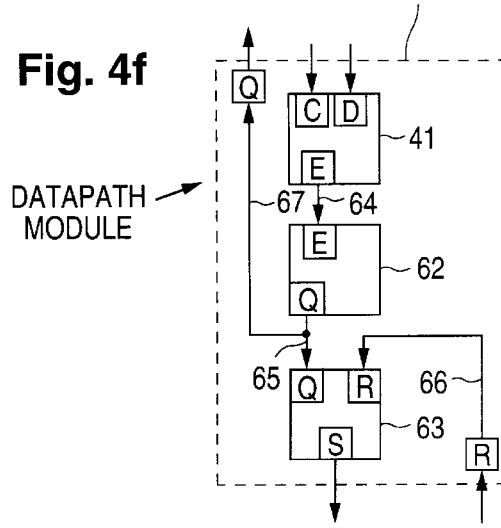

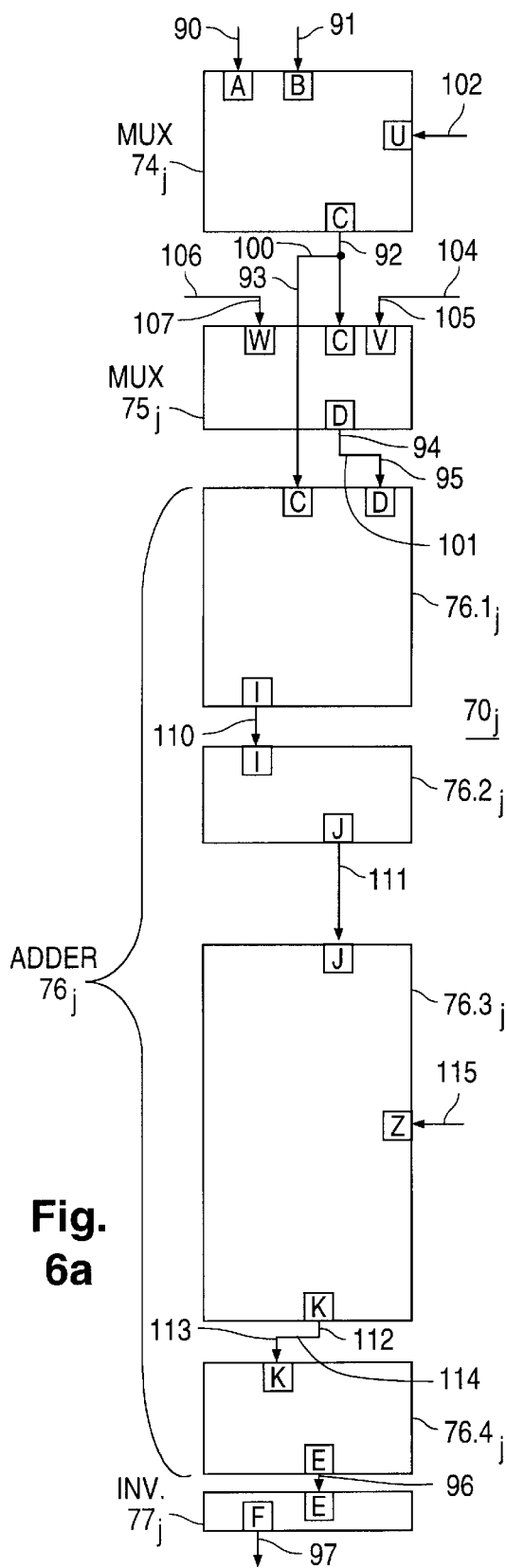
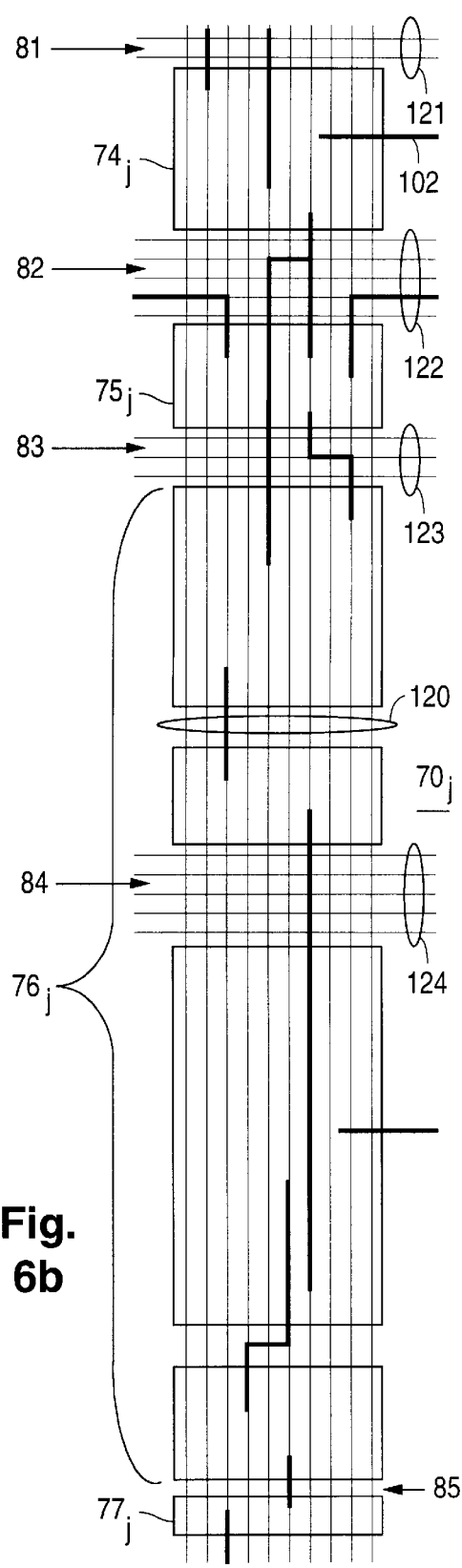
Fig. 6a
Fig. 6b

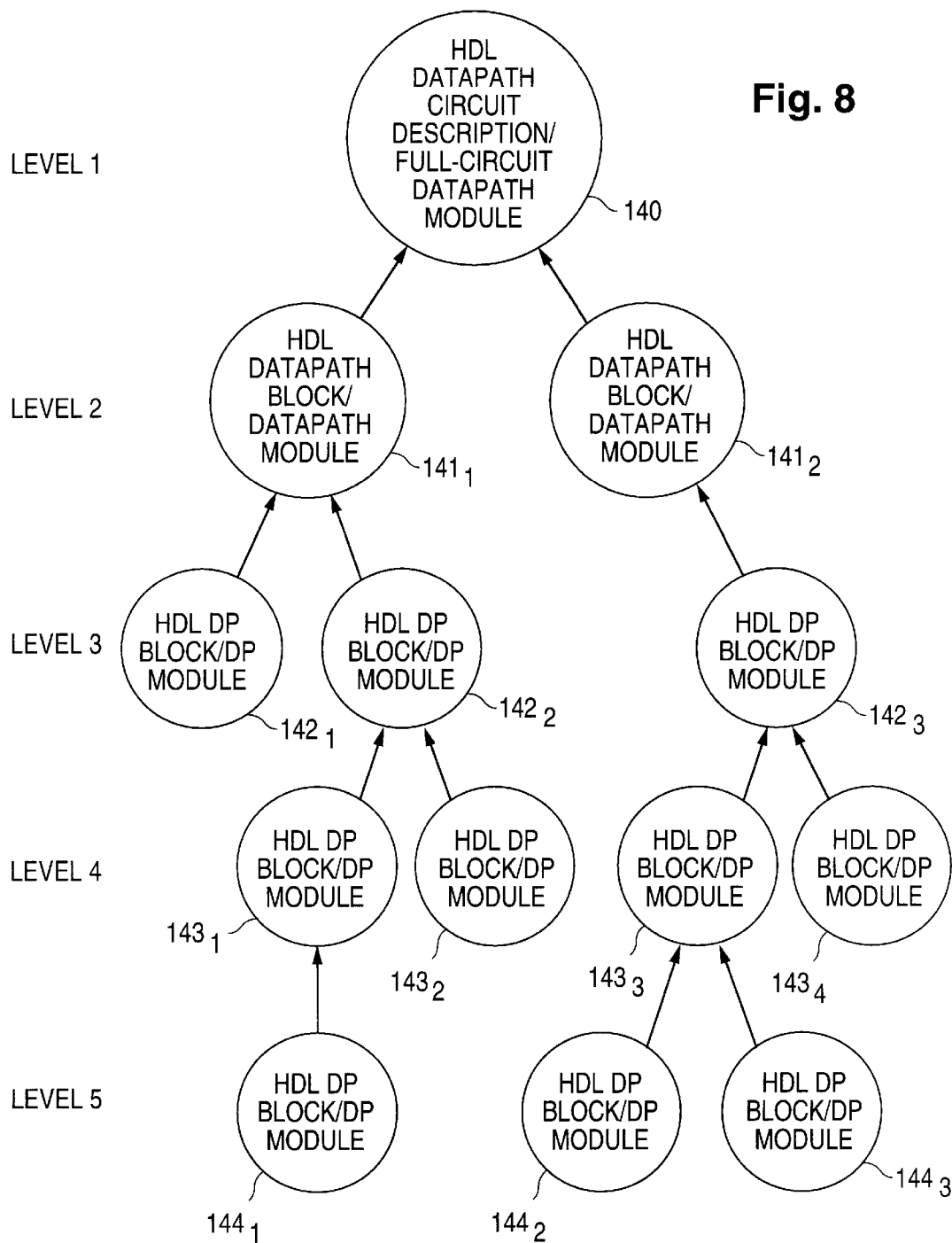

```
                  ┌─────────────────────────────────────────┐
                  │ FOR RESULTING DATAPATH COMPONENTS -- I.E.,│
                  │ ORIGINAL DATAPATH COMPONENTS PLUS ANY NEW │
                  │ DATAPATH COMPONENTS FORMED BY             │── 153
                  │ INTERCONNECTION THROUGH ONE OR MORE DATAPATH
                  │ ...                                       │
                  └─────────────────────────────────────────┘
```

```
       ┌───────────────────────────────────────────────────────────────┐
       │ FOR RESULTING DATAPATH COMPONENTS -- I.E.,                    │
       │ ORIGINAL DATAPATH COMPONENTS PLUS ANY NEW                     │
       │ DATAPATH COMPONENTS FORMED BY                                 │ ─ 153
       │ INTERCONNECTION THROUGH ONE OR MORE DATAPATH                  │
       │ LINES MINUS ANY ORIGINAL DATAPATH COMPONENTS                  │
       │ INVOLVED IN SUCH INTERCONNECTION -- IN THAT HDL               │
       │ DATAPATH BLOCK, DETERMINE EACH DIFFERENT                      │
       │ ONE-DIMENSIONAL CONFIGURATION OF THOSE                        │
 FROM  │ RESULTING DATAPATH COMPONENTS FOR WHICH (A)                   │
 Fig. 9a│ EACH COMPONENT OUTPUT PORT THAT SIGNAL-WISE                  │
       │ MATCHES A COMPONENT INPUT PORT IS CONNECTED                   │
       │ THROUGH AT LEAST ONE DATAPATH LINE TO THAT                    │
       │ COMPONENT INPUT PORT, (B) EACH MODULE INPUT                   │
       │ PORT IS IDENTICAL WITH, OR IS CONNECTED THROUGH,              │
       │ AT LEAST ONE DATAPATH LINE TO EACH COMPONENT                  │
       │ INPUT PORT WHICH SIGNAL-WISE MATCHES THAT                     │
       │ MODULE INPUT PORT, AND (C) EACH MODULE OUTPUT                 │
       │ PORT IS IDENTICAL WITH, OR IS CONNECTED THROUGH,              │
       │ AT LEAST ONE DATAPATH LINE TO ONE COMPONENT                   │
       │ OUTPUT PORT WHICH SIGNAL-WISE MATCHES THAT                    │
       │ MODULE OUTPUT PORT, AND, FOR EACH OF THESE                    │
       │ ONE-DIMENSIONAL CONFIGURATIONS, COUNT NUMBER                  │
       │ OF INSTANCES IN WHICH DATAPATH LINE                           │
       │ NON-REDUNDANTLY PASSES DATPATH COMPONENT                      │
       └───────────────────────────────────────────────────────────────┘
                                      │
                                      ▼
       ┌───────────────────────────────────────────────────────────────┐
       │ PLACE RESULTING DATAPATH COMPONENTS OF THAT HDL               │
       │ DATAPATH BLOCK IN PARTICULAR ONE-DIMENSIONAL                  │
       │ CONFIGURATION, IF ONLY ONE, OR IN SELECTED ONE OF             │
       │ PARTICULAR ONE-DIMENSIONAL CONFIGURATIONS, IF                 │ ─ 154
       │ MORE THAN ONE, FOR WHICH NUMBER OF INSTANCES IN               │
       │ WHICH DATAPATH LINE NON-REDUNDANTLY PASSES                    │
       │ RESULTING DATAPATH COMPONENT IS MINIMUM AMONG                 │
       │ ALL DIFFERENT ONE-DIMENSIONAL CONFIGURATIONS OF               │
       │ RESULTING DATAPATH COMPONENTS TO FORM DATAPATH                │
       │ MODULE FROM RESULTING DATAPATH COMPONENTS,                    │
       │ SUBJECT TO ANY TIMING CONSTRAINT                              │
       └───────────────────────────────────────────────────────────────┘
                                      │
                                      ▼
                    END OF DATAPATH LINE MINIMIZATION
                         FOR THAT HDL DATAPATH BLOCK
```

METHOD AND APPARATUS UTILIZING DATAPATH LINE MINIMIZATION TO GENERATE DATAPATH FLOOR PLAN FOR INTEGRATED CIRCUIT

FIELD OF USE

This invention relates to floor planning for integrated circuits ("ICs") and, in particular, to techniques and equipment for producing an IC datapath floor plan.

BACKGROUND ART

The design and manufacture of an IC is performed in a number of generally distinct stages. Referring to the drawings, FIG. 1 illustrates the basic stages typically present in designing and manufacturing an IC today, especially using current computer-aided design ("CAD") tools.

The starting point in FIG. 1 is a high-level behavioral description 20 of the IC to be produced. Behavioral description 20 prescribes what the IC does—i.e., how a particular circuit design should respond to a given set of input signals. Various levels of abstraction, such as the algorithm level and the logic level, are utilized in describing the IC's behavior. The algorithm level can be presented at the register-transfer level ("RTL"), which basically consists of a set of registers and broad combinatorial logic functions, using a hardware description language ("HDL"). Boolean equations are commonly used to specify logic relationships in description 20.

A structural description 21 of the IC is synthesized from behavioral description 20. Structural description 21, which likewise can be specified at various levels of abstraction, prescribes the requisite circuit components and the interconnections between the circuit components, typically in the form of a netlist. The circuit components are commonly implemented with cells accessed from one or more cell libraries. The cells normally include (a) primitive cells such as inverters, basic logic gates (e.g., AND gates), and D-type flip flops and (b) macrocells such as adders and multipliers. Each macrocell either consists of primitive cells or is a custom design.

A physical description 22 of the IC is synthesized from structural description 21. Physical description 22 is normally embodied as a layout of the selected primitive cells, the selected custom macrocells, electrical lines for appropriately interconnecting the cells, and electrical lines extending to contact pads for making external connections to the IC. Using physical description 22, an IC die that implements structural description 21, and thus behavioral description 20, is manufactured and packaged to produce final integrated circuit 23. At least part of the IC functions are often performed along a multi-bit datapath—i.e., a datapath of multiple bitslices—in IC 23.

The structural and physical synthesis operations that lead from behavioral description 20 to physical description 22 can be performed in a large number of ways. For an IC having a multi-bit datapath, there are three basic methods for synthesizing the datapath portions of the design: fully automatic, semi-automatic, and manual. See FIG. 2. In the fully automatic case, CAD tools are used to perform structural synthesis while physical synthesis is done with automatic place and route ("AP&R") tools. Automated tools are also used for physical synthesis in the semi-automatic case. However, structural synthesis is performed by manual schematic entry. In the manual case, sometimes referred to as full custom design, both structural and physical synthesis are done manually.

Each of the three basic types of structural/physical synthesis has advantages and disadvantages. The design time is the shortest with fully automatic and the longest with manual. Conversely, the IC die size, preferably as small as reasonably possible, is the smallest with manual and the largest with fully automatic. Along the datapath, manual structural/physical synthesis typically provides the best performance and utilizes the smallest amount of die area, whereas fully automatic structural/physical synthesis generally provides the worst performance and employs the largest amount of die area.

More particularly, each bitslice $B_j$ in an IC having a multi-bit datapath consisting of N bitslices is implemented with cells that are largely repeated for each other bitslice $B_j$, where j is an integer running from 0 (the least significant bit) to N−1 (the most significant bit). It is generally desirable that the cells in each bit slice $B_j$ be arranged in a column in the final IC layout, that the column for each bitslice $B_j$ be situated laterally next to the column for the next higher-numbered bitslice $B_{j+1}$, and that functionally corresponding cells in adjoining bitslices $B_j$ and $B_{j+1}$ be situated laterally next to each other. This also applies to one-bitslice cell portions of custom multi-bitslice macrocells, where laterally adjacent one-bitslice portions are functionally corresponding even though they do not necessarily repeat the same circuitry. Consequently, arranging the cells (and/or one-bitslice cell portions of custom multi-bitslice macrocells) in a one-dimensional sequence is an important task in datapath design.

By arranging the bitslices in the preceding manner, the amount of die area that must be allocated for interconnecting cells is normally minimized. Consequently, die area occupied by the datapath circuitry is normally the minimum, or close to the minimum. Also, the lengths of the signal paths for corresponding signals in different bitslices are very nearly the same. Signal skew which arises from differences in the lengths of the datapaths of corresponding signals in different bitslices is largely minimized. Accordingly, performance degradation that results from signal skew is largely minimized.

The bitslices in a multi-bit datapath for an IC synthesized according to the manual approach are normally arranged in the foregoing one-dimensional manner. It is for this reason that the manual approach general yields the best performance and the smallest die size. In the semi-automatic approach, structural synthesis requires that a one-dimensional datapath sequence of the above type for the datapath circuit components be generated. The automatic tooling that performs the physical synthesis in the semi-automatic approach endeavors to implement this one-dimensional sequence. As a result, the performance degradation due to signal skew is normally quite low when structural/physical synthesis is performed according to the semi-automatic technique.

In the fully automatic approach, little ordering of the cells is currently prescribed during structural synthesis. During physical synthesis, the placement of the cells for each bitslice is performed largely independently of the placement of the cells for each other bitslice. Corresponding cells in consecutively numbered bit slices—e.g., bitslices $B_j$ and $B_{j+1}$—are not necessarily located next to each other. Nor are the cells in each bitslice $B_j$ necessarily arranged physically in a one-dimensional sequence. Signal skew that results from this largely random placement of the cells normally leads to significant performance degradation compared to the semi-automatic and manual approaches. Likewise, the datapath die area in an IC synthesized according to the fully automatic technique is large due to the increased area that must be allocated for interconnecting the cells.

FIG. 3 illustrates an example of how the structural/physical synthesis for an IC having a multi-bit datapath is conventionally performed to convert behavioral description 20 into physical description 22. In FIG. 3, HDL circuit description 31 corresponding to behavioral description 20 is provided at the RTL level. RTL synthesis and timing analysis, represented by block 32, is performed on HDL description 31 utilizing macrocells and primitive cells accessed from cell libraries 33 and 34. Critical timing requirements, represented by block 35, are also included in RTL synthesis/timing analysis 32.

The result of RTL synthesis/timing analysis 32 is netlist 36 corresponding to structural description 21. Netlist 36 is a hierarchical netlist. A silicon compiler 37 performs cell placement on netlist 36 to produce layout 38 corresponding to physical description 22.

As mentioned above, structural/physical synthesis is performed separately on each bitslice of a multi-bit datapath in the fully automatic approach. Due to the resulting effectively random placement of cells, both the die area and the signal skew are large. It would be desirable to have a systematic technique that can be employed on a datapath-wide basis across the bitslices of a multi-bit IC datapath to produce an IC datapath floor plan whose die area is reduced to that typically achieved with semi-automatic structural/physical synthesis and approaches that achieved with the full custom design methodology. It would also be desirable if the synthesis technique could be at least partly automated and performed with apparatus such as a computer.

GENERAL DISCLOSURE OF THE INVENTION

The present invention furnishes such a systematic technique for synthesizing a datapath floor plan of an integrated circuit having a multi-bit datapath. The synthesis technique of the invention centers around minimizing, or substantially minimizing, the number of datapath lines utilized in the datapath.

The present synthesis technique can readily be applied on a datapath-wide basis across the bitslices of the datapath. In particular, the synthesis technique of the invention typically yields a highly optimal one-dimensional sequence for the cells (or one-bitslice cell portions in the case of multi-bitslice custom macrocells) of a bitslice of the datapath. This one-dimensional sequence is repeated for each other bitslice. Functionally corresponding cells in adjoining bit slices are thereby situated laterally next to one another in the datapath floor plan. This organization is substantially followed in generating a die layout for the IC. Accordingly, the IC die area is much less than the IC die area that would typically arise from using a fully automatic structural/physical synthesis technique of the prior art.

Subject to any critical timing constraints that may be prescribed for the IC, the present datapath synthesis technique is readily capable of being performed in an automated manner with apparatus such as a computer, thereby reducing the design time to a low level comparable to that achieved with automatic structural synthesis. However, contrary to what occurs in conventional fully automatic synthesis, the synthesis technique of the invention introduces little signal skew into the datapath. Since the present invention is directed towards minimizing the number of datapath lines, the IC datapath die area is typically reduced to a value close to what would result from using a manual structural/physical synthesis technique. The invention thus achieves the advantages of prior art synthesis techniques while substantially avoiding their disadvantages.

In utilizing the datapath line minimization technique of the invention to perform synthesis, a datapath module of an IC normally implements a datapath function of a corresponding datapath block presented in a hardware description language. The datapath function of the HDL datapath block is translated into suitable datapath components which are configured into a one-dimensional sequence to form the datapath module. In some HDL versions, the collection of datapath components which implement the HDL datapath function is referred to as a "module" even though a one-dimensional sequence for the datapath components is not yet determined. To alleviate confusion with respect to the meaning of "module", the term "datapath module" here refers to the collection of datapath components when both their interconnections and one-dimensional sequence are determined. The term "datapath block" refers to the collection of datapath components prior to determination of the one-dimensional sequence for the datapath components.

More particularly, the present invention is utilized to generate a datapath module by configuring multiple datapath components into a one-dimensional datapath sequence that extends in the datapath direction—i.e., the direction in which information is physically processed along the datapath. Each datapath component has at least one input port and at least one output port. The datapath module likewise has at least one input port and at least one output port.

Inasmuch as the datapath components are combined to form the datapath module, the signal received at each module input port matches the signal supplied to at least one of the component input ports. Similarly, the signal supplied from each module output port matches the signal supplied from at least one of the component output ports. As used here in describing the relationship between a pair of ports, "match" or "signal-wise match" means that the datapath signals supplied to/from the two ports are intended to be the same signal.

Multiple datapath lines extend in the datapath direction. The datapath components are susceptible of being placed in a number of different one-dimensional configurations for which the ports of the datapath components and, as necessary, the datapath module are interconnected through datapath lines to provide the module function.

In each of these possible one-dimensional configurations, each component output port that signal-wise matches a component input port normally is connected through at least one datapath line to that component input port. Also, each module input port normally is identical with, or is connected through at least one datapath line to, each component input port which signal-wise matches that module input port. Each module output port likewise normally is identical with, or is connected through at least one datapath line to, each component output port which signal-wise matches that module output port.

In a method aspect of the invention, the number of instances in which a datapath line non-redundantly passes a datapath component is counted for each of a plurality of such one-dimensional configurations of the datapath components. The plurality of configurations considered in the counting step preferably includes everyone of the possible one-dimensional configurations of datapath components that satisfy the above-mentioned porting requirements. Subject to any timing constraint, the datapath components are then placed in a particular one of the plurality of one-dimensional configurations for which the number of instances in which a datapath line non-redundantly passes a datapath component is the minimum among the plurality of one-dimensional configurations examined during the counting step.

Each datapath component is typically formed with one or more implementations of datapath cells accessed from at least one cell library. The datapath cells may consist of primitive cells and/or macrocells.

For many datapath cells, a particular function can be performed by any one of two or more cell layout variations, each accommodating a different number of datapath lines. The various cells that provide a given function typically have the characteristic that reducing the number of datapath lines that can be accommodated in a cell layout reduces the cell area. Also, configuring all the bitslices in the same one-dimensional sequence with functionally corresponding cells in adjoining bitslices situated laterally next to one another normally reduces the amount of die area that must be allocated for interconnecting cells. By minimizing the number of datapath lines accommodated by the datapath components and by situating functionally corresponding cells laterally next to one another in the datapath area, the IC die area is reduced to a low level for a given set of IC design rules.

The number of different one-dimensional configurations of datapath components in a datapath module generally increases in a factorial manner with the number of datapath components and can potentially become quite large. A special procedure is, however, preferably employed in the invention to reduce the plurality of different one-dimensional datapath-component configurations considered during the counting step to a typically manageable number. The special configuration-reducing procedure depends on the fact that certain of the datapath cells utilized in forming a typical datapath module are normally single-input/single-output cells. That is, each such cell has a single input port and a single output port, or effectively a single output port. Consequently, certain of the original datapath components that would be considered during the counting step if the special procedure were not employed in the invention are single-input/single-output components.

The special procedure is performed before the counting step to reduce the number of datapath components considered during the counting step and thus to decrease the number of different possible one-dimensional configurations of the datapath components examined during the counting step. In particular, the configuration-reducing procedure entails first determining whether there is any instance in which the output port of a single-output datapath component, referred to here as the leading datapath component, signal-wise matches the input port of only one other single-output datapath component, referred to here as the following datapath component, provided that at least one of the single-output datapath components in such a signal-matched pair has a single input port.

If at least one such signal-matched pair of non-interconnected signal-output datapath components is found, the leading datapath component in one such signal-matched pair is, subject to any timing constraint, positioned immediately before that pair's following datapath component in the one-dimensional datapath sequence. An interconnection is established through at least one datapath line between the two signal-wise matched ports. The two so-interconnected datapath components now form a larger datapath component.

Again subject to any timing constraint, the determining and positioning steps of the special procedure are repeated as much as necessary on signal-matched pairs of non-interconnected datapath components until no such signal-matched pair of non-interconnected datapath components remains. When this point is reached, the counting and placing steps in the datapath line minimization technique of the invention are performed on the resulting datapath components—i.e., the original datapath components plus any datapath components formed by such interconnections minus any original datapath components involved in such interconnections.

The counting steps in the present datapath line minimization technique can be done manually or with apparatus such as a computer according to an appropriate computer program. In the apparatus case, the apparatus contains circuitry for performing the counting step along with circuitry for identifying at least one one-dimensional sequence of the datapath components for which the number of instances in which a datapath line non-redundantly passes a datapath component is a minimum among the plurality of one-dimensional configurations.

The earlier determining and positioning operations of the special procedure can also be performed manually or with apparatus such as the computer. In the apparatus case, the apparatus then includes circuitry for performing the determining operation as well as circuitry for assigning, subject to any timing constraint, the leading datapath component in one such signal-matched pair of non-interconnected datapath components to a position immediately before the following datapath component with an interconnection being established between the two components.

While the datapath line minimization technique of the invention has been described specifically for a datapath module, the present datapath line minimization technique can be applied across an IC that is to be arranged in an hierarchy of datapath modules generated from an HDL description of the IC. In this case, a plurality of HDL datapath blocks are derived from an HDL description of the IC for which at least one HDL datapath block is contained in at least one other HDL datapath block in a hierarchy of levels of HDL datapath blocks allocated into one or more branches. Each HDL datapath block provides a specified datapath function.

The datapath function of each HDL datapath block is translated into multiple datapath components suitable for a corresponding datapath module. The present datapath line minimization technique is then performed on the datapath components in each HDL datapath block starting at the lowest level in each branch. The present invention can thus be employed in performing datapath synthesis for part or all of the datapath circuitry in an IC.

BRIEF DESCRIPTION OF THE DRAWINGS

FIGS. 4a, 4b, 4c, 4d, 4e, and 4f are block diagrams of examples of datapath components that can be utilized in generating an IC datapath floor plan in accordance with the invention.

FIGS. 6a and 6b are expanded views of the floor-plan diagram of part of the datapath components in the datapath module of FIG. 5. FIG. 6a symbolically depicts exemplary input and output ports for the illustrated datapath components, while FIG. 6b illustrates exemplary locations for datapath lines and transverse lines, including channel lines.

FIG. 8 is a block diagram that presents a exemplary hierarchy of the HDL datapath blocks/datapath modules in an IC on which the methodology of FIG. 7 can be employed.

FIGS. 9a and 9b together form a flow diagram of the steps in the datapath line minimization stage of the flow diagram of FIG. 7.

Like reference symbols are employed in the drawings and in the description of the preferred embodiments to represent the same, or very similar, item or items.

Figure 1:
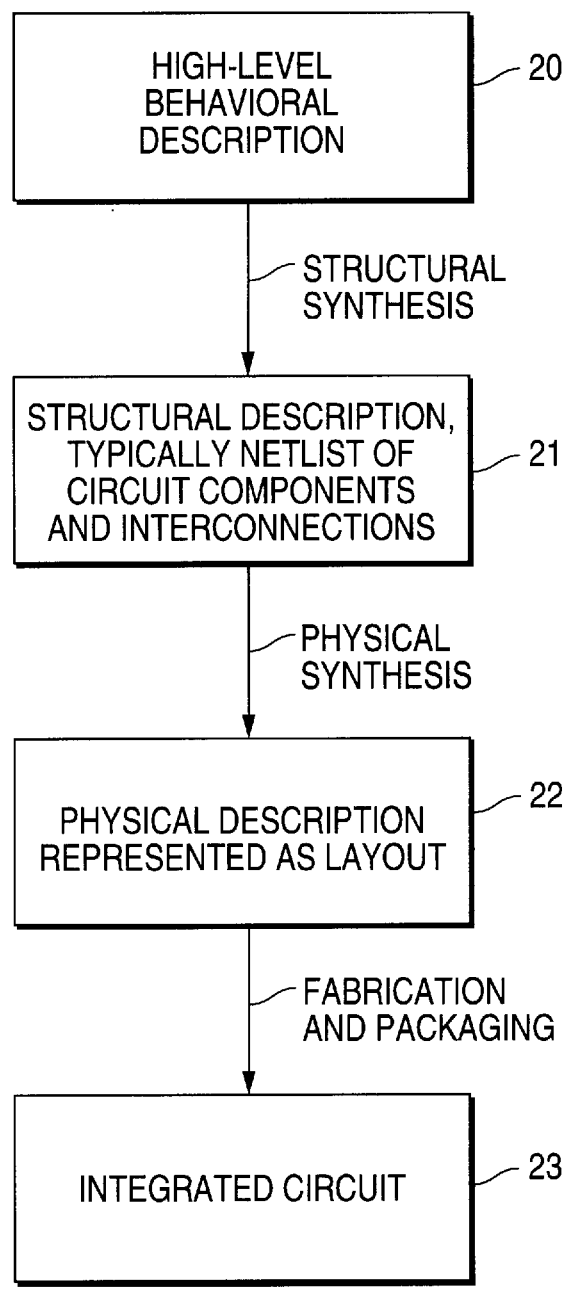
FIG. 1 is a flow diagram of a conventional methodology for producing an IC starting from a high-level behavioral description.
Figures 2, 3:
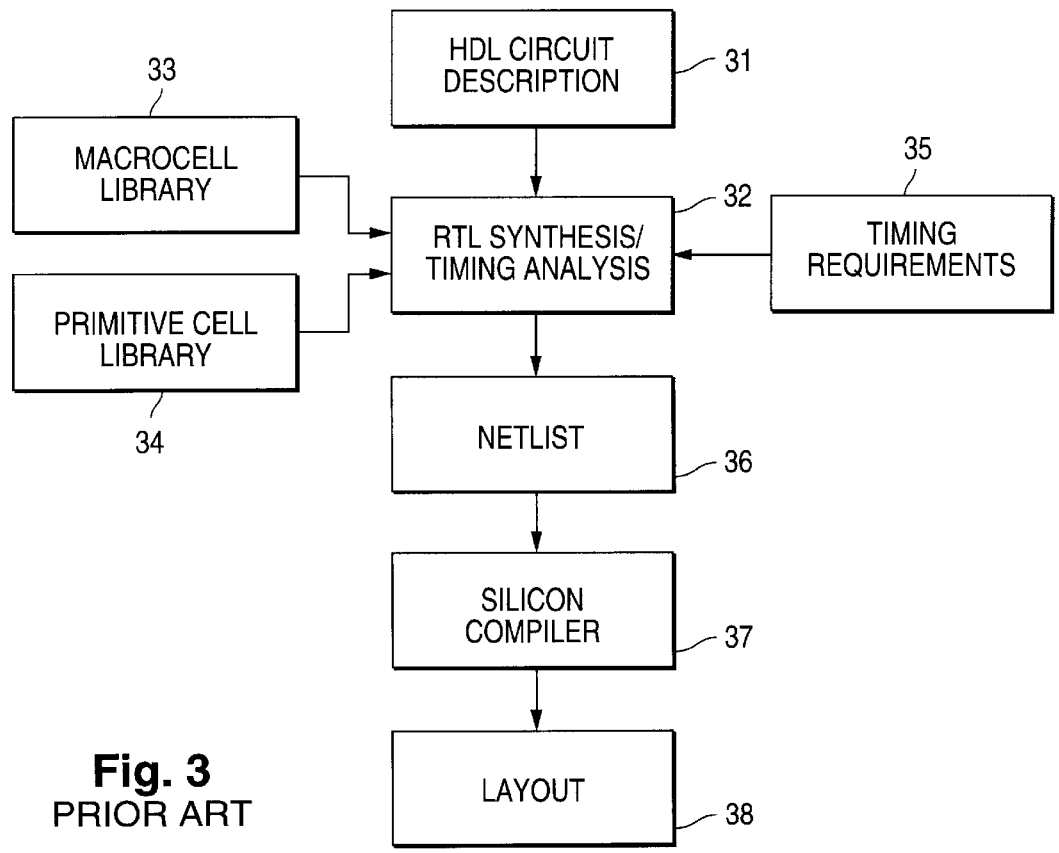
FIG. 2 is a chart that presents different ways for converting a high-level behavioral description of an IC into a layout for the IC.
FIG. 3 is a flow diagram of a conventional methodology for synthesizing the layout of an IC from an HDL description of the IC.

In the drawings each input port is typically illustrated as a small, generally square block with an arrow that points towards and touches the block. Each output port is typically illustrated as a small, generally square block with an arrow that touches and points away from the block.

A component input port labeled with the same letter as a component output port in a particular figure indicates that the two component ports are signal-wise matched. That is, the signal provided from the component output port is to be supplied to the component input port. A component input port labeled with the same letter as a module input port in a particular figure indicates that the two ports are signal-wise matched. The signal passing through the module input port is to be passed on to the component input port. Similarly, a module output port labeled with the same letter as a component output port in a particular figure indicates that the two ports are signal-wise matched. The signal provided from the component output port is to be passed through the module output port.

DESCRIPTION OF THE PREFERRED EMBODIMENTS

Building Blocks of Datapath Line Minimization

An understanding of the present datapath line minimization technique is facilitated by examining the building blocks used in performing datapath line minimization to generate a datapath floor plan for an IC module. The datapath floor planning technique of the invention is performed on datapath components of various types. Each datapath component may have one or more input ports and one or more output ports.

Some of the datapath components are implementations of primitive datapath cells available from a primitive cell library. Primitive cells include inverters, AND gates, OR gates, NAND gates, NOR gates, AND-OR-invert gates, OR-AND-invert gates, exclusive OR gates, exclusive NOR gates, transmission gates, latches, single-output registers (such as D-type flip-flops), buffers (such as three-state buffers), and multiplexers.

Other datapath components are implementations of datapath macrocells available from a macrocell library. Datapath macrocells include adders, multipliers, arithmetic logic units, register files, detect "0" devices, and detect "1" devices. Each datapath macrocell consists of a pre-specified sequence of primitive datapath cells or is a custom design. Each datapath component formed with a single datapath cell, whether a primitive cell or a macrocell, normally has a single output port and at least one input port.

Yet other datapath components consist of sequences of two or more (implementations of) datapath cells. The interconnection of the datapath cells in each datapath component of this type is determined by applying the datapath line minimization technique of the invention. A datapath component formed with two or more datapath cells, but not all of the datapath cells in an HDL datapath block, constitutes a datapath group. Each datapath group normally has a single output port and at least one input port. Finally, a datapath component formed with all the datapath cells in a datapath block constitutes a datapath module having at least one input port and at least one output port.

In some cases, a multi-bitslice datapath component—e.g., an adder—may have, or may be viewed as having, two or more output ports—e.g., sum and carry output ports for an adder. In applying the datapath line minimization technique of the invention, little weight is given to a carry output port since it is only one bit wide. An adder is typically treated as having only one output port, namely the sum output port.

The same treatment can be applied to other "multi-output" multi-bitslice datapath components in which the bit widths of all but one of the output ports are small compared to the bit width of the datapath. That is, each such multi-output multi-bitslice component can be treated as having only a single output port—i.e., the output port whose bit width is not small compared to the datapath bit width—when applying the present datapath line minimization technique. Quantitatively, the bit width of a multi-bit output port is typically considered to be small relative to datapath bit width when the number of bits in the output port is less than half the number of bits (bitslices) in the datapath.

The foregoing comments carry over to single-bit portions of multi-output multi-bitslice datapath components. If the bit widths of all but one of the output ports of a multi-output multi-bitslice datapath component are small compared to the datapath bit width, the weighting of each output port of small bit width is small in a single-bitslice portion of the multi-bitslice component compared to a single bit output port of the single-bitslice portion. In applying the datapath line minimization technique of the invention to a single bitslice of the datapath, a single-bitslice portion of a multi-bitslice datapath component having only one output port whose bit width is not small compared to the datapath bit width can thus be treated as having a single one-bit output port.

Alternatively, in handling a multi-bit output port whose bit width is less than the datapath bit width, a weighting factor can be applied to the output port. The weighting factor is typically the ratio of the bit width of the output port to that of the datapath. In applying datapath line minimization according to the invention, the output port is then treated as a fractional output port whose fractional contribution is the weighting factor. This approach can be employed across the full width of the datapath and on single-bitslice portions of the datapath.

As illustrated in certain of the drawings discussed below, a generally rectangular portion of the IC die area is allocated to each datapath component. Each datapath input signal provided to a datapath cell normally enters the appropriate cell input port along one transverse side, typically depicted as the top side, of the cell's generally rectangular periphery, while the datapath output signal provided from the cell normally leaves the cell output port along the opposite transverse side, typically depicted as the bottom side, of the cell's periphery. The same applies to datapath input and output signals for a datapath group.

The datapath input and output signals for a datapath module enter and leave the module along opposing transverse sides, typically represented as top and bottom sides, of the module's generally rectangular periphery. However, a datapath input signal is not restricted to entering the datapath module along only one of these two sides. Nor is the datapath output signal restricted to leaving the datapath module only along the other of these two opposing sides. Both input and output signals thus can enter and leave the datapath module along the top side or the bottom side.

In some situations, an output signal of a datapath component is not supplied as a datapath input signal to any other datapath component but instead serves as a control signal or is employed in generating one or more control signals. Such an output signal, which may be one or more bits wide, can leave a datapath component from one of its longitudinal sides, typically depicted as the left and right sides. This has no impact on the datapath line minimization technique of the invention.

Datapath input signals are provided to datapath components along parallel datapath lines extending in the datapath direction (the direction of data flow). Likewise, datapath output signals are provided from datapath components along parallel datapath lines extending in the datapath direction.

Datapath lines can be physically classified in two categories: basic datapath lines and routing datapath lines. In the final IC layout, a basic datapath line physically extends in the datapath direction. A routing datapath line constitutes either (a) a single basic datapath line for physically interconnecting two ports in the IC layout or (b) two or more basic datapath lines, or segments of datapath lines, interconnected through one or more lines, or line segments, extending generally transverse (perpendicular) to the datapath direction so as to form one overall line for interconnecting two ports in the IC layout. In other words, a routing datapath line is either a substantially straight line extending in the datapath direction or a jagged line extending generally in the datapath direction.

The present datapath line minimization technique is performed in an abstract sense on datapath components of an IC during structural synthesis to determine an abstract one-dimensional sequence which is converted into a physical one-dimensional sequence in laying out the IC during subsequent physical synthesis. A datapath line considered in applying the datapath line minimization technique is converted into a routing datapath line during IC layout. However, the fact that a datapath line may actually be implemented in the IC layout as a jagged line is not of concern in applying the datapath line minimization technique of the invention to generate the abstract one-dimensional sequence of datapath components.

Certain datapath components may have input/output ports, sometimes termed inout ports. An input/output port is a two-way port—i.e., a port through which information is received at certain times and through which information is provided at other times. An input/output port is typically associated with a bus accessible through three-state buffers. For a given input/output signal, a datapath component may have one or two component input/output ports depending on whether the datapath line carrying that input/output signal ends in the datapath component or goes fully across the datapath component.

An input/output port of a datapath component is here treated as a type of input port insofar as information enters the datapath component through the component input/output port. Similarly, an input/output port of a datapath component is here treated as a type of output port insofar as information leaves the datapath component through the component input/output port. Because input ports and output ports are handled in a substantially symmetric manner in the present datapath line minimization technique, the treatment of an input/output port as an input port, an output port, or a combination of an input port and an output port is not particularly material here.

Control signals are supplied to certain datapath components, such as multiplexers and arithmetic logic units, to control their operation. For the most part, control signals enter these datapath components through their longitudinal (left and right) sides. Some control signals, while having been carried on lines extending in the direction transverse to the datapath direction, enter certain datapath components through their transverse (top and/or bottom) sides. Lines carrying control signals often pass datapath components in the transverse direction. However, the control signal lines generally do not pass any datapath components in the datapath direction. As a result, the control signal lines are normally of no concern to the datapath line minimization technique of the invention.

For a particular cell function (e.g., an OR function or a multiplexer function), the appropriate cell library typically provides two or more versions of a basic cell layout for implementing that function. Each variation of the basic cell layout has a different width to accommodate a different number of datapath lines. As the number of accommodatable datapath lines is reduced for a particular cell function, the cell area typically decreases. For example, an inverter cell that can accommodate eight datapath lines typically occupies less area than an inverter cell that can accommodate ten datapath lines.

There are two reasons why the cell area decreases as the number of accommodatable datapath lines is reduced in providing a particular cell function. For some cell functions, the dimension of the basic cell is fixed in the datapath direction but decreases in the transverse direction as the number of accommodatable datapath lines is reduced. For other cell functions, the cell dimension in the datapath direction increases as the number of accommodatable datapath lines increases while the cell dimension in the transverse direction decreases. However, the percentage increase of the cell dimension in the datapath direction is less than the percentage decrease of the cell dimension in the transverse direction, leading to an overall reduction in the cell area. In any case, utilizing cells with a smaller number of accommodatable datapath lines typically leads to a reduction in cell area.

The minimum spacings between, and the widths of, the datapath lines for an IC are determined by the particular design rules used to generate the physical layout from which the IC is manufactured. For any particular set of design rules, application of the datapath minimization technique of the invention yields substantially the minimum datapath die area that can be achieved with that set of design rules.

Depending on the cell function to be performed, a cell can be provided from the appropriate cell library in a single-bit slice version and/or in one or more multi-bit slice versions. For example, a primitive NAND-gate cell can be provided in a single-bitslice version or in various multi-bitslice versions such as a 16-bit NAND gate. Certain cells, typically custom macrocells such as adders, are normally available only in certain multi-bit slice versions. Special efforts need to be undertaken to design adder generators for producing an arbitrary number of bits in a pre-defined range. Since datapath blocks tend to be bitslice repetitive, the present invention focuses on single-bitslice operation to generate a single-bitslice floorplan and then duplicates the single-bitslice floorplan for the remaining bitslices.

FIGS. 4a–4f illustrates examples of the preceding types of datapath components. The datapath direction extends vertically from top to bottom in each of FIGS. 4a–4f. FIG. 4a depicts a single-input/single-output datapath component 40 formed with a primitive datapath cell having one input port A and one output port B. FIG. 4b depicts a multiple-input/single-output datapath component 41 having two input ports C and D and one output port E.

FIG. 4c depicts a single-input/single-output datapath component 42 containing primitive datapath cells 43 and 44. Datapath cell 43 has one input port F and one output port G. Datapath cell 44 has one input port G and one output port H. Since the output port of cell 43 is labeled with the same letter "G" as the input port of cell 44, these two ports are signal-wise matched. The output signal from output port G of cell 43 is provided on datapath line 45 as the input signal to input port G of cell 44. Input port F of cell 43 is the single input port for datapath component 42. Output port H of cell 44 is the single output port for datapath component 42.

Datapath component 42 can represent a datapath macrocell, a datapath group, or a datapath module. Component 42 constitutes a datapath macrocell when the interconnection by way of line 45 is pre-specified—i.e., the interconnection is specified in the macrocell library from which the macrocell is obtained. When the interconnection by way of line 45 is determined by applying the present datapath line minimization technique, component 42 constitutes a datapath group or a datapath module depending on whether cells 43 and 44 constitute part or all of the datapath components in the immediate HDL datapath block containing cells 43 and 44.

FIG. 4d shows a multiple-input/single-output datapath component 46 containing datapath cells 47, 48, and 49. Datapath cell 47 has one input port I and one output port J. Datapath cell 48 has two input ports K and L and one output port M. Datapath cell 49 has two input ports J and M and one output port L. The output signal from output port J of cell 47 is supplied on datapath line 50 as the input signal to signal-wise matched input port J of cell 49. Similarly, the output signal from output port M of cell 48 is supplied on datapath line 51 as the input signal to signal-wise matched input port M of cell 49.

Datapath component 46 has two input ports, one of which is formed by cell input port I. The second input port of component 46 consists of component input port K connected by datapath line 52 to signal-wise matched input port K of cell 48. Cell output port L constitutes the single output port of component 46. In addition, the output signal supplied from output port L of cell 49 is provided by way of feedback datapath line 53 as the input signal to signal-wise matched input port L of cell 48.

As with datapath component 42, datapath component 46 can represent a datapath macrocell, a datapath group, or a datapath module. Component 46 constitutes a datapath macrocell when the interconnections by way of datapath lines 50–53 are pre-specified. When the interconnections by way of lines 50–53 are determined in accordance with the invention, component 46 is a datapath group or a datapath module depending on whether cells 47–49 constitute part or all of the datapath components in the immediate HDL datapath block containing cells 47–49.

FIG. 4e depicts a multiple-input/single-output datapath component 54 formed with primitive datapath cell 55, datapath component 42 described above, and datapath module 56. Datapath cell 55 has two input ports O and N and one output port F. Datapath module 56 has two input ports H and P and one output port O. The signal from output port F of cell 55 is supplied on datapath line 57 to input port F of component 42. Similarly, the signal from output port H of component 42 is supplied on datapath line 58 to input port H of module 56.

Datapath component 54 has two input ports, one formed with cell input port N. The second input port of component 54 consists of component input port P connected by datapath line 59 to input port P of module 56. Module output port O of module 56 constitutes the single output port of component 54. Also, the signal from output port O of module 56 is supplied on feedback datapath line 60 to input port O of cell 55.

Datapath component 54 may constitute a datapath group or a datapath module depending on whether components 55, 42, and 56 constitute part or all of the datapath components in the immediate HDL datapath block containing components 55, 42, and 56. In the module case, component 54 is a higher-level datapath module in a hierarchy of at least two datapath modules for which module 56 is the lower-level datapath module.

FIG. 4f depicts a multiple-input/multiple-output datapath component 61 formed with primitive datapath cell 41 described above and primitive datapath cells 62 and 63. Datapath component 62 has one input port E and one output port Q. Datapath component 63 has two input ports Q and R and one output port S. The output signal from output port E of cell 41 is supplied on datapath line 64 to input port E of cell 62. Similarly, the output signal from output port Q of cell 62 is supplied on datapath line 65 to input port Q of cell 63.

Datapath component 61 has three input ports, two of which are formed with cell input ports C and D situated along the top side of the component periphery. The third input port of component 61 consists of component input port R situated along the bottom side of the component periphery and connected by datapath line 66 to input port R of cell 63. Component 61 has two output ports, one formed with cell output port S situated along the bottom side of the component periphery. The second output port of component 61 consists of component output port Q situated along the top side of the component periphery and connected by way of datapath line 67 to output port Q of cell 62.

Datapath component 61 is normally a datapath module for two reasons. Firstly, component 61 has multiple output ports and thus is typically not a datapath macrocell or a datapath group, each of which is typically limited to a single output port or effectively a single output port. Secondly, at least one datapath input signal enters component 61 along the same side, either the top or bottom side, of the component periphery that at least one datapath signal leaves component 61. Since the datapath output signal of a datapath macrocell is normally restricted to leaving the macrocell from the opposite side of the cell's periphery to which each input signal enters the macrocell, component 61 is typically not a datapath macrocell. For the same reason, component 61 is typically not a datapath group.

Although not shown in any of FIGS. 4c–4f, an input signal to a datapath module can be provided to two or more datapath components in that datapath module. Similarly, an output signal from a datapath component in the datapath module can be supplied to two or more other datapath components in that datapath module. Also, the output signals from two or more datapath components in a datapath module can be furnished, at different times, through an output port, often an input/output port, of the datapath module. This situation typically arises when the datapath components that provide the output signals to the module output port are three-state buffers.

Figure 5:
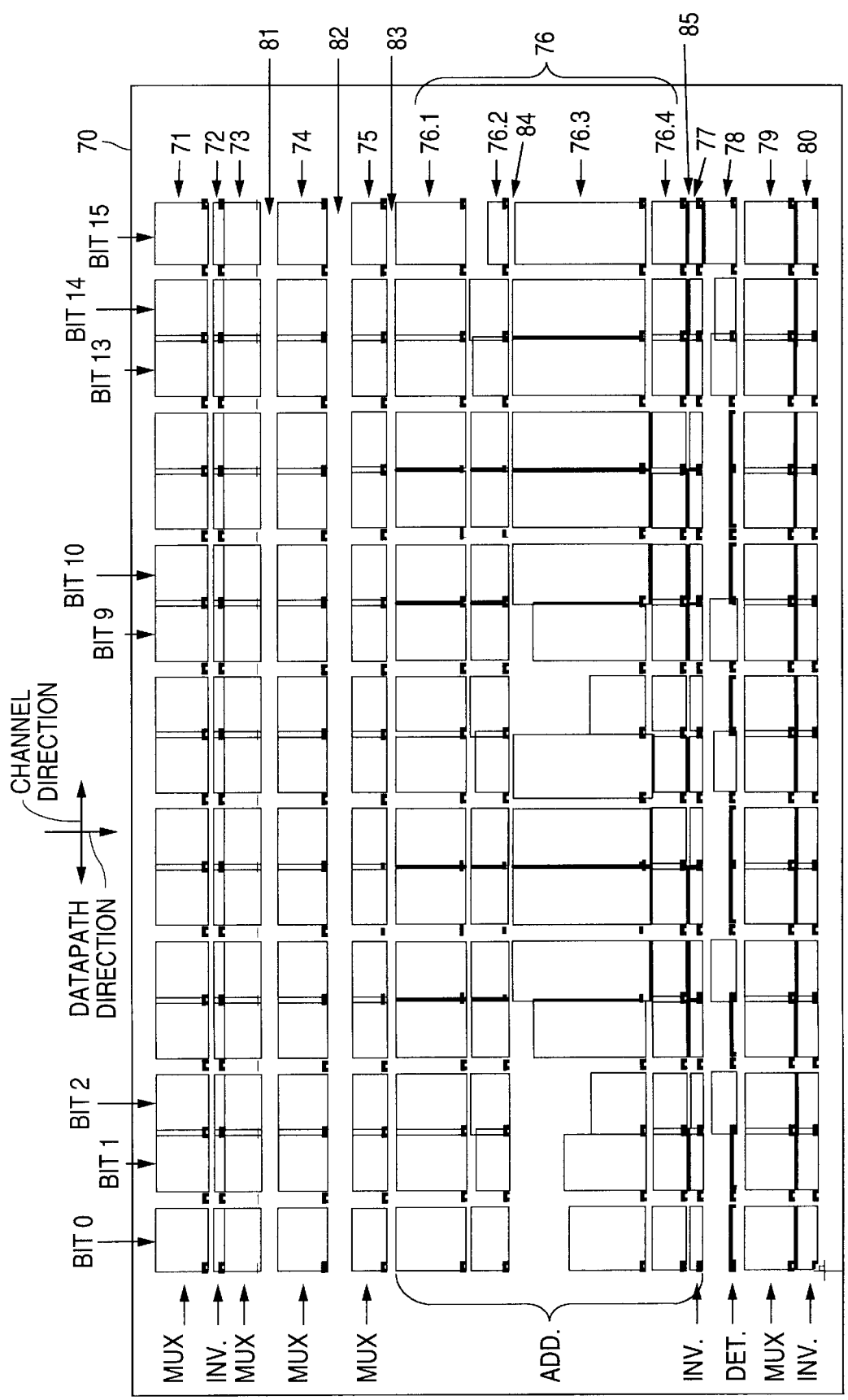
FIG. 5 is a floor-plan diagram of the datapath components in a datapath module whose floor plan is organized in accordance with the invention.
Figure 7:
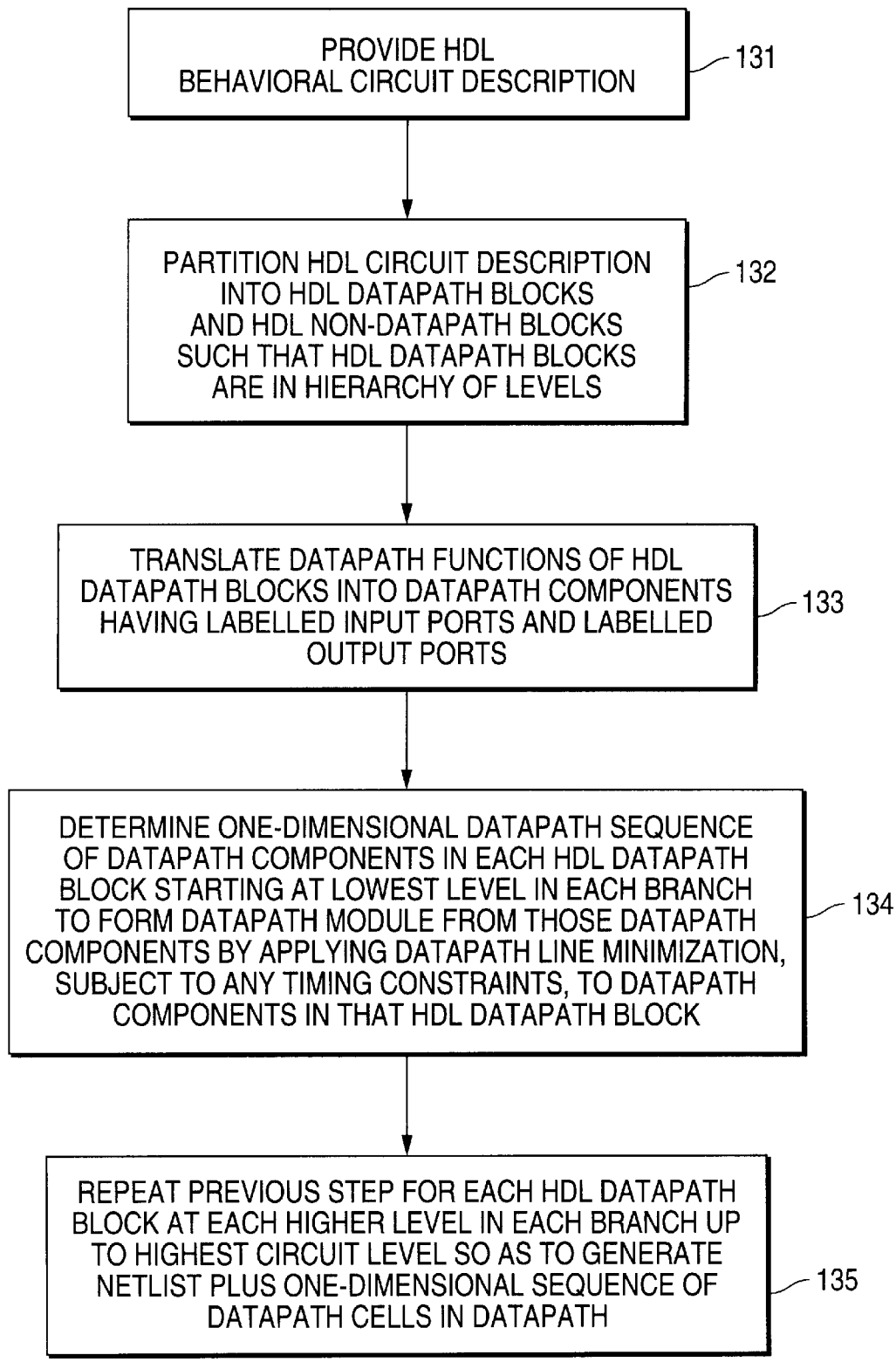
FIG. 7 is a flow diagram of a methodology that employs the teachings of the invention for converting the datapath portion of a behavioral description of an IC into a description of the datapath portion of the IC.

FIG. 5 illustrates a typical floor plan for a datapath module 70 created from an HDL description of a corresponding datapath block by employing the present datapath line minimization technique during structural synthesis. The floor plan of FIG. 7 is substantially followed during subsequent physical synthesis to generate a layout for module 70. Consequently, the organization of the datapath components in the module layout substantially replicates the floor plan of FIG. 5.

Datapath module 70 in the floor plan consists of datapath components 71–80 arranged sequentially in the indicated manner to form a 16-bit datapath consisting of bits 0, 1, . . . 15. Bit 0 is the least significant bit. Bit 15 is the most significant bit. No datapath lines or other interconnect lines are shown in FIG. 5.

Datapath components 71–75 and 77–80 are implementations of primitive single-output datapath cells. Each of components 71, 73–75, and 79 is a multiplexer ("MUX") having a single 16-bit output port. Components 72, 77, and 80 are inverters having 16-bit output ports. Each of components 71–75, 77, 79, and 80 consists of sixteen replications of the same circuitry, one replication for each bitslice of the datapath. Component 78 is a custom detector having a 16-bit input port and a 1-bit output port at bitslice 0. While detector 78 receives 16 bits of input information, the circuitry that processes the input information is present largely at only seven of the bitslices, indicating the custom nature of detector 78.

Datapath component 76 is an implementation of a custom datapath macrocell adder having a 16-bit sum output port and a 1-bit carry output port. Since the bit width of the carry output port is small compared to the 16-bit size of the datapath, adder 76 is here treated as effectively having only a single output port. As indicated in FIG. 5, adder 76 is formed with primitive datapath stages 76.1–76.4. Each of stages 76.1–76.4 consists of sixteen functionally corresponding portions, one portion for each bitslice of the datapath. The circuitry in the sixteen portions of each adder stage can vary from portion to portion, as particularly as indicated by the different sizes of the sixteen rectangular areas that contain the circuitry for stage 76.3.

In the landscape drawing of FIG. 5, the datapath direction extends from the top of the drawing to the bottom. A channel extending in a channel direction transverse (perpendicular) to the datapath direction is situated between each pair of consecutive 16-bit datapath components i and i+1, where i is an integer running from 71 to 79. A channel extending in the channel direction is also situated between each pair of consecutive 16-bit primitive datapath cells 76.i and 76.i+1 in adder 76, where i now runs from 1 to 3. Five such channels 81–85 are indicated in FIG. 5. Due to the scale at which datapath module 70 is illustrated in FIG. 5, no channels appear to exist between certain pairs of consecutive primitive datapath cells, such as cells 79 and 80. However, a channel does indeed exist between each such pair of apparently touching cells. Channel 85 is an example.

Lines that provide part of the physical interconnection mechanism for carrying datapath signals from certain bitslice portions of datapath module 70 to other bitslice portions of module 70 may be situated in the channels. Lines for carrying some control signals may also be situated in the channels. Signal lines situated in the channels do not pass any of the datapath components in the datapath direction. Consequently, the channel lines are not considered in applying the datapath line minimization technique of the invention. However, should a channel line carrying a datapath signal from one bitslice portion of datapath module 70 to another bitslice portion of module 70 be connected to a datapath line that passes a datapath component in the datapath direction, such an occurrence may be considered in applying the datapath line minimization technique of the present invention depending on the bit width of the output port connected to that channel line or on whether the above-mentioned fractional weighting approach is being employed.

Let each bitslice of 16-bit datapath module 70 be represented by symbol 70$_j$, where j is an integer running from 15 to 0. The value of integer j is the bit (or bitslice) number. Datapath module 70 can then be viewed as consisting of sixteen single-bitslice datapath modules 70$_{15}$–70$_0$. Similarly, let each bitslice of each of 16-bit datapath components 71–80 be represented by the reference symbol for that 16-bit component followed by the subscript j, where j has the previously defined meaning. Each single-bitslice datapath module 7$_j$ can then be viewed as consisting of single-bitslice datapath components 71$_j$–80$_j$.

FIGS. 6a and 6b illustrate equal-size expanded views of part of one single-bitslice datapath module 70$_j$ centered around single-bitslice datapath components 74$_j$–77$_j$. Integer j could, for example, correspond to the vertical slice for bit 9 in FIG. 5. A largely symbolic view of exemplary input, output, and control ports for components 74$_j$–77$_j$ is presented in FIG. 6a. FIG. 6b presents a corresponding physical view, essentially a partial layout view, of exemplary routing datapath lines associated with the exemplary ports depicted in FIG. 6a.

In going from a symbolic port/datapath line representation such as that of FIG. 6a to a physical datapath line representation such as that of FIG. 6b, an input port for a datapath component in the symbolic representation is considered to be situated at the location in the physical representation where the datapath line carrying the datapath input signal for that input port crosses the periphery of the die area allocated to that datapath component. Similarly, an output port for a datapath component in the symbolic representation is considered to be situated at the location in the physical representation where a datapath line carrying the datapath output signal from that output port crosses the periphery of the component's die area. This applies even though a datapath line carrying an input or output signal actually terminates at some distance into the die area for the component.

In FIG. 6a, datapath components $74_j$–$77_j$ have various input and output ports A, B, C, D, E, and F in the datapath. Datapath signals variously travel to, between, and from datapath components $74_j$–$77_j$ on datapath lines 90–97. Datapath line 93 branches off datapath line 92 by way of channel line 100 to form a multi-segment datapath line that connects output port C of MUX $74_j$ to input port C of adder $76_j$.

Datapath lines 94 and 95 are interconnected by way of channel line 101 to form a multi-segment datapath line that interconnects output port D of MUX $75_j$ to input port D of adder $76_j$. The reason for using two basic datapath lines, or lines segments, to connect output port D of MUX $75_j$ to input port D of adder $76_j$ is that the output signal from output port D of MUX $75_j$ is not available in the die area allocated to MUX $75_j$ at a location vertically aligned to the location at which the input signal to input port D in adder $76_j$ can be received in the die area allocated to adder $76_j$. The two basic datapath lines (94 and 95) in conjunction with the intervening channel line (101) effectively act as one datapath line in applying the datapath line minimization technique of the invention to the HDL datapath block that contains components 71–80.

A control signal is provided on transverse line 102 to control port U of MUX $74_j$. A control signal is provided to control port V of MUX $75_j$ by way of a composite multi-segment control line whose segments include channel line 104 and vertical line 105. In addition, the output signal of another component (not shown in FIGS. 6a or 6b), potentially a datapath component, is provided to input port W of MUX $75_j$ by way of a multi-segment datapath line whose segments include channel line 106 and datapath line 107.

Items I, J, and K in FIG. 6a indicate internal input and output ports for adder $76_j$. Item Z is an internal control port for adder $76_j$. Within adder $76_j$, FIG. 6a also shows basic datapath lines 110–113, channel line 114, and transverse line 115. Lines 112–114 form a routing datapath line.

Turning to FIG. 6b, locations 120 that can accommodate basic datapath lines extend in the datapath direction along all of datapath components $70_j$. The darkened vertical line segments in FIG. 6b indicate basic datapath lines which are provided along portions of locations 120 and which correspond to datapath lines 90–97, 107, and 110–113 and vertical control line 105 in FIG. 6a. As FIG. 6b indicates, a basic datapath line that terminates in a particular datapath component can extend far into that datapath component— i.e., the basic datapath line does not have to terminate close to the entry point.

Locations 121–124 that can accommodate lines in respective channels 81–84 extend in the channel direction across datapath component $70_j$. Channel-line locations 121–124 and other such channel-line locations extend fully across all of datapath components $70_{15}$–$70_0$ in 16-bit datapath component 70. The darkened horizontal line segments in FIG. 6b indicate channel lines 100, 101, 104, 106, and 114 and transverse lines 102 and 115. Multi-segment datapath lines 92/100/93, 94/101/95, and 112/114/113 in FIG. 6a form jagged routing datapath lines in FIG. 6b.

Implementation of Datapath Line Minimization

With the foregoing in mind, the present technique for applying datapath line minimization to generate a datapath floor plan for an IC having a one-dimensional multi-bit datapath can readily be understood. FIG. 7 illustrates the major steps in structurally synthesizing such an IC utilizing the datapath line minimization technique of the invention to substantially minimize the IC datapath die area. Blocks 131–135 represent these steps.

As indicated in block 131, the first step is to provide a behavioral description of the IC in a hardware description language. Verilog HDL and VHDL are examples of suitable hardware description languages. An example of part of a typical HDL behavioral description of an IC is given below in connection with FIG. 13.

The HDL circuit description is partitioned into HDL datapath blocks and HDL non-datapath blocks. See block 132. The HDL non-datapath blocks provide circuit functions performed outside the datapath. For example, control functions are often performed outside the datapath, and, when so performed, are included in HDL non-datapath blocks.

The HDL datapath blocks form a hierarchy of levels. In going from the highest level to the lowest level, the HDL datapath blocks also typically form a number of branches. The lowest level in one branch of HDL datapath blocks may differ from the lowest level in another branch. Inasmuch as each HDL datapath block is converted into a datapath module, the resultant IC typically contains datapath modules that form a branched hierarchy of levels identical to that of the HDL datapath blocks.

FIG. 8 depicts an example of a typical branched hierarchy of levels for HDL datapath blocks and the corresponding datapath modules. The example in FIG. 8 is a five-level hierarchy in which level 1 is the highest level, and level 5 is the lowest level. The overall HDL datapath circuit description corresponding to the datapath module for the full IC is given at level 1, represented by circle 140. In the illustrated example, the HDL datapath circuit description contains two HDL datapath blocks/datapath modules 141 and 1412 at level 2. Branching therefore occurs in going from level 1 to level 2.

Further branching occurs in going to lower levels. At level 3, there are three HDL datapath blocks/datapath modules $142_1$–$142_3$. Blocks/modules $142_1$ and $142_2$ are branches of blocks/modules $141_1$. The abbreviation "DP" in FIG. 8 means datapath. Four HDL datapath blocks/datapath modules $143_1$–$143_4$ are at level 4. Finally, at level 5 there are three HDL datapath blocks/datapath modules $144_1$–$144_3$. As shown in FIG. 8, the lowest level in each branch varies from one branch to another.

Returning to FIG. 7, each HDL datapath block provides a specified datapath function. With the HDL datapath blocks having been derived from the HDL behavioral circuit description, the datapath functions of the HDL datapath blocks are translated into datapath components having labeled input ports and labeled output ports as indicated in block 133. At least one of the component input ports is also an input port for that HDL datapath block and thus an input port for the corresponding datapath module created from that datapath block. Likewise, at least one of the component output ports is also an output port for that datapath block and thus an output port for the corresponding datapath module.

Datapath line minimization is now applied, subject to any timing constraints, to the datapath components of the HDL datapath block at the lowest level in each branch to determine a one-dimensional sequence (or configuration) for the datapath components in that datapath block and thereby form the corresponding datapath module. See block 134 in FIG. 7. At the beginning of operation 134, all of the datapath components in each datapath block at the lowest level are datapath cells. Each so-formed datapath module constitutes a datapath component in a HDL datapath block at the next higher level.

Datapath line minimization is now performed on the datapath components in each datapath block at each higher level in each branch up to the highest circuit level as indicated in block 135. The result of operations 134 and 135 in FIG. 8 is a netlist plus the desired one-dimensional sequence of datapath cells in the datapath. The various individual datapath line minimization steps that form operations 134 and 135 can be performed in various orders, provided that the datapath line minimization for each datapath module included in a higher-level datapath module is completed before performing the datapath line minimization to form the higher-level datapath module. For example, all of the datapath modules in the branch that begins with circle $141_1$ in FIG. 8 can be determined before determining any of the datapath modules in the branch that begins with circle $141_2$.

Figure 9A:
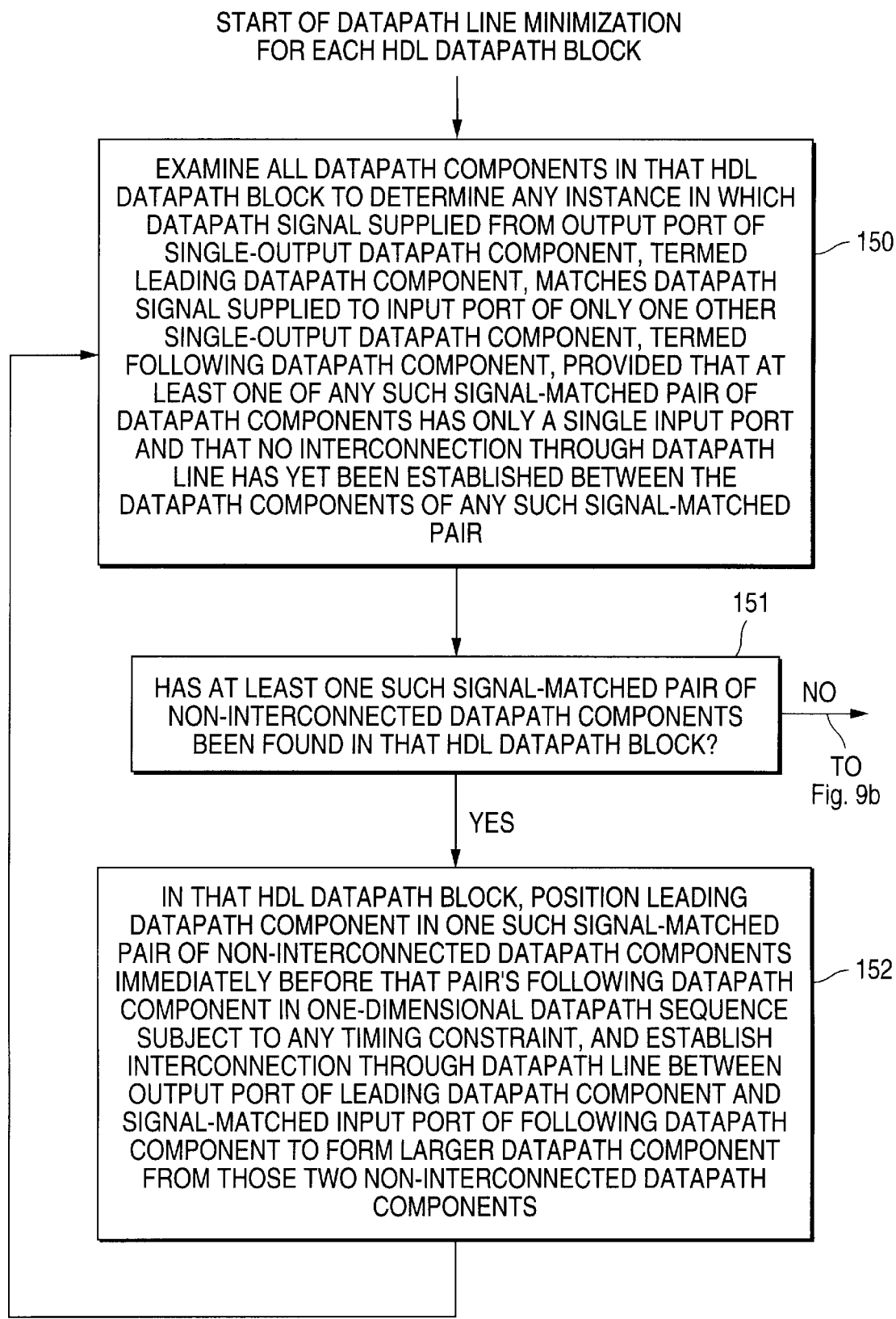

FIGS. 9a and 9b (collectively "FIG. 9") illustrate generally how datapath line minimization in accordance with the invention is performed on the datapath components of an HDL datapath block at the stage represented by operations 134 and 135 in FIG. 8 to determine a one-dimensional data sequence for arranging the datapath components so that they are interconnected to form a datapath module which implements the datapath function of the HDL datapath block. Subject to any timing constraints, the one-dimensional sequence determined by applying the method of FIG. 9 defines a module floor plan whose layout area is normally the minimum, or close to the minimum, among all such module floor plans that could utilize the same datapath components to implement the datapath function of the HDL datapath block for a given set of layout design rules.

As described below, the datapath line minimization technique of the invention involves (a) counting the number of instances in which a datapath line passes a datapath component in each of a plurality of different one-dimensional configurations of a set of datapath components and, subject to any timing constraint, (b) positioning those datapath components in one of the one-dimensional configurations for which the count is a minimum. The counting step, illustrated in FIG. 9b along with the positioning step, could be performed on everyone of the different one-dimensional configurations of the original datapath components in the HDL datapath block. However, the number of different one-dimensional sequences of the datapath components increases factorally with the number of datapath components. For N datapath components, there are N!—i.e., N(N–1)(N–2) . . . 2.1—different one-dimensional sequences of the datapath components.

Also, the number of instances to be counted typically increases with the number of datapath components. Performing the counting step on each one of the different possible one-dimensional configurations of the original datapath components could, if the number of original datapath components is moderately large, require an inordinately large amount of time. Accordingly, a special procedure, illustrated in FIG. 9a, is normally performed before the counting step to reduce the number of datapath components, and thus the number of different one-dimensional configurations of datapath components, examined during the counting step. The special configuration-reducing procedure of FIG. 9a implements a time-wise shortened partial version of the function performed by the counting and positioning steps in FIG. 9b but without going through the counting step.

The configuration-reducing procedure of FIG. 9a is basically a looping operation, especially when performed in a systematic way. The loop is entered at block 150 in FIG. 9a. Upon entering the loop, all the datapath components in the HDL datapath block under consideration are examined to determine whether there is any instance in which the datapath signal from the output port of a single-output datapath component, referred to here (for convenience) as the leading datapath component, matches—i.e., is the same as—the datapath signal supplied to an input port of only one other single-output component, referred to here (for convenience) as the following datapath component, provided that:

A. At least one of the two datapath components in any such signal-matched pair of datapath components has only a single input port, or effectively only a single output port, and B. No interconnection through at least one datapath line has yet been established between the datapath components in any such signal-matched pair.

Step 150 can be performed by examining all the datapath components in the HDL datapath block to identify any single-output datapath components and, if there are at least two single-output datapath components, examining the single-output datapath components to identify any such signal-matched pair of single-output datapath components that satisfy provisions A and B.

A decision point, indicated in block 151 of FIG. 9b, arises depending on whether any such signal-matched pair of non-interconnected datapath components is found in the HDL datapath block under consideration during step 150. The term "non-interconnected" here means that, as given in provision B above, no interconnection through at least one datapath line has yet been abstractly established between the datapath components in any such signal-matched pair.

There are three basic categories of signal-matched pairs of non-interconnected datapath components that meet the requirements of step 150: (1) a single-input/single-output datapath component that uniquely signal-wise matches another single-input/single-output datapath component, (2) a single-input/single-output leading datapath component that uniquely signal-wise matches a multiple-input/single-output following datapath component, and (3) a multiple-input/single-output leading datapath component that uniquely signal-wise matches a single-input/single-output following datapath component. For convenience, a pair of datapath components that fall into any of these three categories is often referred to here as a unique signal-matched pair of non-interconnected datapath components. Note that a pair of multiple-input/single-output non-interconnected datapath components in which the output port of one of the multiple-inputs/single-output datapath components signal-wise matches an input port of the other multiple-input/single-output datapath component does not fall into any of the three categories and thus does not constitute a unique signal-matched pair of non-interconnected datapath components as specified here.

If at least one unique signal-matched pair of non-interconnected datapath components is found, the leading datapath component in one such signal-matched pair of non-interconnected datapath components is assigned the position immediately before the following datapath component in the one-dimensional datapath sequence, subject to any timing constraint. See block 152. Also, a connection through at least one datapath line is established between the output port of the leading datapath component in that signal-matched pair and the signal-wise matching input port of the following datapath component. These two now-interconnected datapath components form a larger new datapath component, typically a datapath group.

If two or more unique signal-matched pairs of non-interconnected datapath components are identified during step 150, a decision must be made as to which of these signal-matched pairs of non-interconnected datapath components is to be subjected to step 152. Because the configuration-reducing procedure of FIG. 9a is a looping operation, this decision often will not have any effect on the finally determined one-dimensional sequence of datapath components. However, for some input-port/output-port mixes, the choice of the particular signal-matched pair of non-interconnected datapath components to be subjected to step 152 at this point will affect the order of the datapath components in the finally determined one-dimensional datapath sequence.

The decision as to which of the multiple unique single-matched pairs of non-interconnected datapath components is to be subjected to step 152 is preferably made according to the following criteria:

1. If there is at least one unique signal-matched pair of non-interconnected datapath components in which both datapath components are single-input/single-output components, apply step 152 to one such signal-matched pair of non-interconnected single-input/single-output datapath components. Should there be two or more unique signal-matched pairs of non-interconnected single-input/single-output datapath components, a decision must be made as to which of the signal-matched pairs of non-interconnected single-input/single-output components is to be subjected to step 152. This decision can be made arbitrarily or can be done according to further specific criteria. For example, step 152 can be applied to the first-identified unique signal-matched pair of non-interconnected single-input/single-output datapath components.

2. If criterion 1 is not met but there is at least one unique signal-matched pair of non-interconnected datapath components in which the leading datapath component is a multiple-input/single-output component (while the following component is a single-input/single-output component), apply step 152 to one unique signal-matched pair of non-interconnected datapath components for which the leading component is a multiple-input/single-output component. Should there be two or more unique signal-matched pairs of non-interconnected datapath components in which the leading component is a multiple-input/single-output component, a decision must be made as to which of these multiple signal-matched pairs of non-interconnected datapath components is to be subjected to step 152. This decision can be made arbitrarily or can be done according to further specific criteria. For example, step 152 can be applied to the first-identified unique signal-matched pair of non-interconnected datapath components for which the leading component is a multiple-input/single-output component. The number of input ports in each multiple-input/single-output leading datapath component can be included in the further criteria. For example, step 152 can be applied at this point to a unique signal-matched pair of non-interconnected datapath components for which the number of input ports in the multiple-input/single-output leading component is the smallest.

3. If criteria 1 and 2 are not met but there is at least one unique signal-matched pair of non-interconnected datapath components in which the following datapath component is a multiple-input/single-output component (while the leading datapath component is a single-input/single-output component), apply step 152 to one signal-matched pair of non-interconnected datapath components for which the following component is a multiple-input/single-output component. Should there be two or more unique signal-matched pairs of non-interconnected datapath components in which the following component is a multiple-input/single-output component, a decision must be made as to which of the signal-matched pairs of non-interconnected datapath components is to be subjected to step 152. This decision can be made arbitrarily or can be done according to further specific criteria. For example, step 152 can be applied to the first-identified unique signal-matched pair of non-interconnected datapath components for which the following component is a multiple-input/single-output component. The number of input ports in each following multiple-input/single-output datapath component can be included in the criteria. For example, step 152 can be applied at this point to a unique single-matched pair of non-interconnected datapath components for which the number of input ports in the multiple-input/single-output following component is the smallest.

After step 152 is completed, step 150 is repeated on the resulting set of non-interconnected datapath components in that HDL datapath block—i.e., on the set of datapath components formed by the original set of datapath components plus any datapath component formed by interconnection through one or more datapath lines due to application of step 150 minus any original datapath components involved in such interconnection. The datapath group formed by the pair of datapath components interconnected due to the application of step 152 is thus added to the set of datapath components for examination during the second application of step 150. The two datapath components designated for interconnection due to the application of step 152 are removed from the set of datapath components to be examined during this application of step 150. The total of non-interconnected datapath components is thereby reduced by one.

If at least one unique signal-matched pair of non-interconnected datapath components is found during the application of step 150 on the new set of non-interconnected datapath components, step 152 is applied to one such signal-matched pair of non-interconnected datapath components in the manner described above. The total number of non-interconnected datapath components is again reduced by one. The looping through steps 150 and 152 continues until no unique signal-matched pair of non-interconnected datapath components is found, each application of step 152 causing the total number of non-interconnected datapath components to be reduced by one.

Upon reaching the condition in which no unique signal-matched pair of non-interconnected datapath components is found in the HDL datapath block under consideration during step 150, the above-mentioned counting step is performed on the resulting set of non-interconnected datapath components in the HDL datapath block being examined. Block 153 in FIG. 9b illustrates the counting step. As a result of the special configuration-reducing procedure of FIG. 9a, the number of non-interconnected datapath components for consideration during counting step 153 has been reduced by a number equal to the number of applications of step 152 from the number of datapath components present prior to the initiation of the special procedure.

During counting step 153, the number of instances in which a datapath line non-redundantly passes a datapath component in the datapath direction is counted for each different one-dimensional configuration of the datapath components for which:

a. Each component output port that signal-wise matches a component input port is connected through at least one datapath line to that component input port, b. Each module input port is identical with, or is connected through at least one datapath line to, each component input port which signal-wise matches that module input port, and c. Each module output port is identical with, or is connected through at least one datapath line to, one component output port which signal-wise matches that module output port.

As used in describing a datapath line that carries a datapath signal past a datapath component, "non-redundantly" means that only one datapath line is employed to carry that signal past the datapath component.

The numbers generated during counting step 153 are examined to determine the minimum number counted and to determine whether there is one, or more than one, one-dimensional configuration of the resulting datapath components corresponding to the minimum counted number. See block 154. If there is only one one-dimensional configuration corresponding to the minimum counted number, the datapath components of the HDL datapath block are structurally placed in that one-dimensional configuration to form the datapath module, subject to any timing constraint.

If there are two or more different one-dimensional configurations corresponding to the minimum counted number, the datapath components are structurally placed in a selected one of these one-dimensional configurations to form the datapath module, again subject to any timing constraint. The selection can be made arbitrarily or can be made according to further criteria. For example, the internal interconnections of datapath components interconnected during the special procedure of FIG. 9a can be examined to make the selection. The placement of the datapath components in a particle one-dimensional configuration for which the number of instances in which a (routing) datapath line passes the datapath component in the datapath direction completes the application of the present datapath line minimization technique to the HDL datapath block under consideration.

When step 150 is first applied to the datapath components in the lowest HDL datapath block in a branch, all of the datapath components are non-interconnected datapath cells. During any other application of step 150, the datapath components include one or more datapath groups or/and one or more datapath modules.

The datapath line minimization technique of FIG. 9 can be variously applied to the bitslices of datapath components in a multi-bit datapath. Preferably, the present datapath line minimization technique is applied to the datapath components in only one bitslice, such as the datapath components in single-bitslice module 70$_j$ of FIG. 6a, to determine a one-dimensional sequence for the datapath components in that bitslice. This one-dimensional sequence is then repeated for the datapath components in each other bitslice of the IC. Corresponding single-bitslice datapath components are assigned positions laterally next to one another in the manner shown in FIG. 5. In this way, the datapath line minimization technique of the invention is applied on a datapath-wide basis to the multi-bitslice datapath components, such as datapath components 71–80, of the IC.

When the datapath line minimization technique of FIG. 9 is applied to a single-bitslice datapath component in a multi-bit HDL datapath block, the term "single-output" or "single-output port" refers to only a one-bitslice portion of the corresponding multi-bit output datapath signal. Likewise the term "single-input" or "single input port" then refers to only a one-bitslice portion of the corresponding multi-bit input datapath signal.

Alternatively, the datapath line minimization technique of FIG. 9 can be applied directly to all the multi-bitslice components—e.g. 16-bitslice datapath components 71–80 of FIG. 5—in a multi-bit datapath to determine a composite one-dimensional sequence for the multi-bitslice components. In this case, the term "single-output" or "single output port" encompasses all the bits that form the corresponding multi-bit output datapath signal. Likewise, the term "single-input" or "single input port" encompasses all the bits that form the corresponding multi-bit input datapath signal.

Regardless of how the present datapath line minimization technique is employed, the result is a netlist along with a floor plan in which the datapath components are arranged in a one dimensional sequence with functionally corresponding cells in adjacent bitslices situated laterally next to one another as, for example, shown in FIG. 5. The netlist lists the datapath components and specifies their interconnections by identifying their ports. The floor plan is substantially followed in laying out the IC during physical synthesis so that the one-dimensional sequence is replicated in the IC layout and later in the IC itself.

Figure 10:
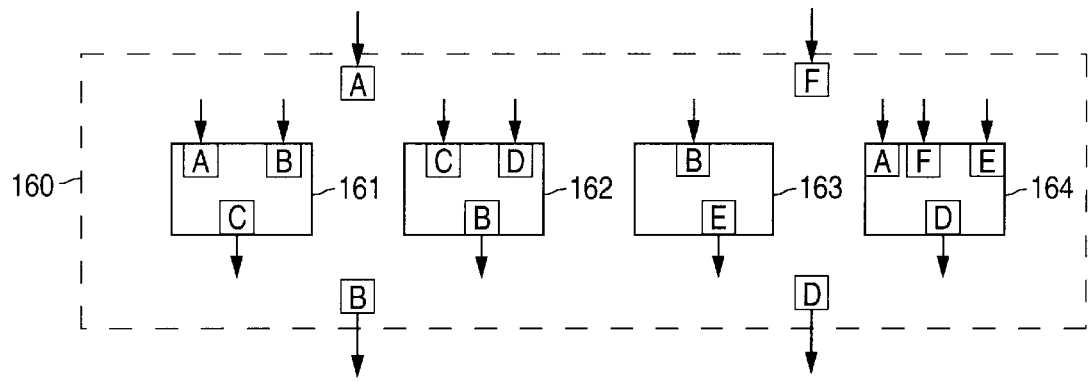
FIG. 10 is a block diagram of typical datapath components in an HDL datapath block that is to be converted into a datapath module.

A specific example of how the datapath line minimization technique of FIG. 9 is applied to an HDL datapath block 160 to produce a datapath module is presented below in conjunction with FIGS. 10, 11a, 11b, and 12a–12f. HDL datapath block 160 is shown in FIG. 10 after the datapath function has been translated into exemplary datapath components 161–164 consisting of datapath cells and/or datapath modules. Datapath components 161–164 have various input and output ports A, B, C, D, E, and F. HDL datapath block 160 has input ports A and F and output ports B and D. Each of ports A–F is preferably one bit wide, but could be multiple bits wide. In the one-bit case, HDL datapath block 160 is normally a bitslice of a larger HDL datapath block containing one or more corresponding further bitslices.

Figure 11A:
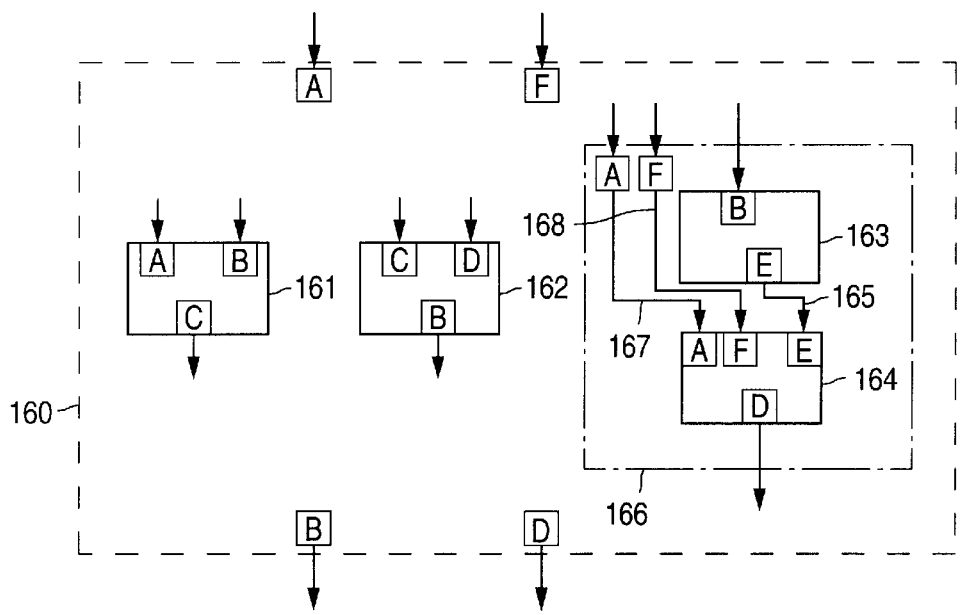
FIGS. 11a and 11b are block diagrams illustrating how the HDL datapath block in FIG. 10 appears after the datapath line minimization technique of the invention has been partly performed on the datapath components in the datapath block.

In performing the special configuration-reducing procedure of FIG. 9a, there is only one instance in which an output port of one of datapath components 161–164 signal-wise matches an input port of only one other of components 161–164. This instance arises with output port E of component 163 and input port E of component 164. Component 163, as the leading datapath component, is therefore positioned immediately before component 164, the following datapath component in the pair of signal-matched components 163 and 164. FIG. 11a shows this positioning.

A connection through datapath line 165 is established between signal-wise matched ports E of components 163 and 164. These two components now form a datapath group 166 that constitutes a new datapath component. Since components 163 and 164 are now interconnected, the resulting set of non-interconnected datapath components consists of components 161, 162, and 166. The number of non-interconnected datapath components in the new set is one less than the number of non-interconnected datapath components in the original set.

Note that datapath components 161 and 163 both have input ports B, and that datapath component 162 has output port B. Because output port B of component 162 is not uniquely signal-wise matched to input port B of only one other datapath component, application of the special procedure of FIG. 9a does not result in connecting output port B of component 162 to input port B of component 161 or to input port B of component 163.

Also note that newly formed datapath component 166 has component input ports A and F respectively connected through datapath lines 167 and 168 to input ports A and F of original datapath component 164. Datapath lines 167 and 168 pass internal datapath component 163 in the datapath direction and, if internal components 163 and 164 were considered during the counting step, would constitute two instances in which a datapath line passes a datapath component. However, these two instances of a datapath line passing a datapath component would be present in every one-dimensional configuration formed with components 161–164 and would therefore not affect the determination of the one-dimensional configuration or configurations for which the number of instances in which a datapath line passes a datapath component is a minimum. Accordingly, as long as the result is definitive, there is no need to further consider lines 167 and 168 in applying the datapath line minimization technique of the invention.

A record is kept of the fact that internal datapath line 165 interconnects internal datapath components 163 and 164 should that information later be needed to assist in selecting a one-dimensional configuration for arranging components 161–164 when application of the counting step yields the same minimum count for two or more different one-dimensional configurations of components 161–164. However, that information is not immediately needed. Accordingly, HDL datapath block 160 can be represented as shown in FIG. 11b where the existence of internal components 163 and 164 and internal datapath lines 165, 167, and 168 is hidden.

Figure 11B:
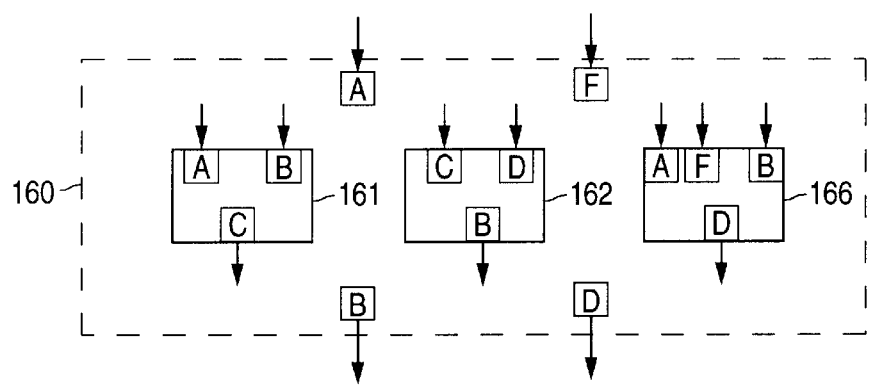
Figure 12A:
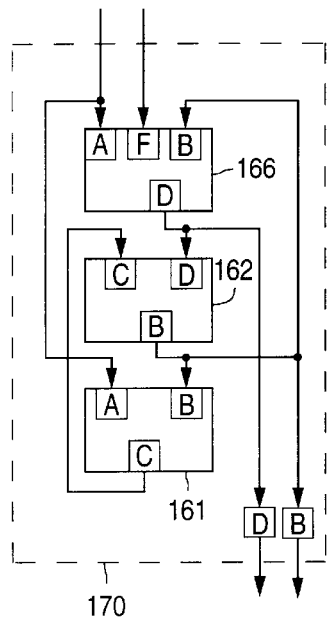
FIGS. 12a, 12b, 12c, 12d, 12e, and 12f are block diagrams of six possible floor plans for the datapath components in FIG. 11b. Datapath line counting is performed on at least these six floor plans.
Figure 12B:
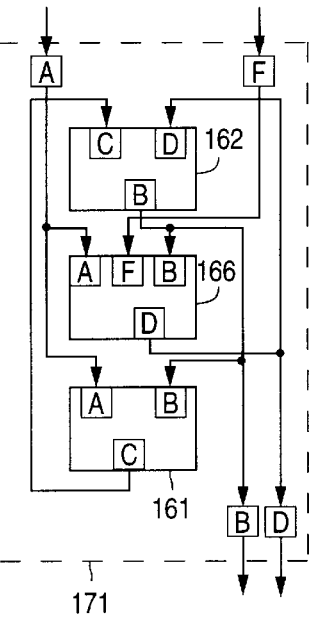
Figure 12C:
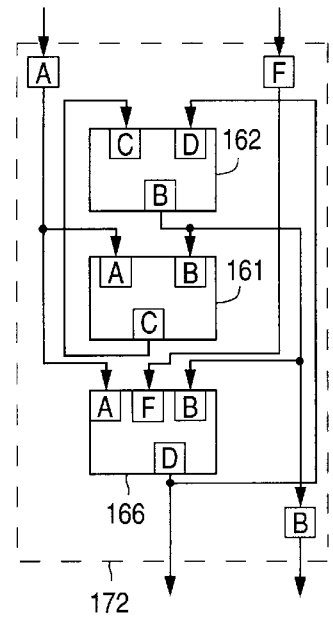
Figure 12D:
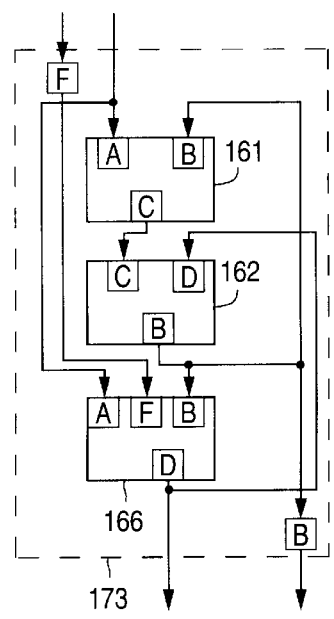
Figure 12E:
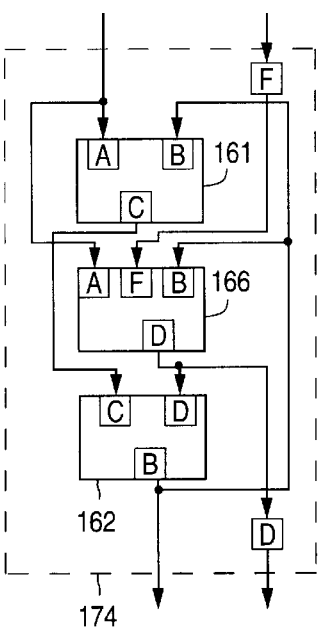
Figure 12F:
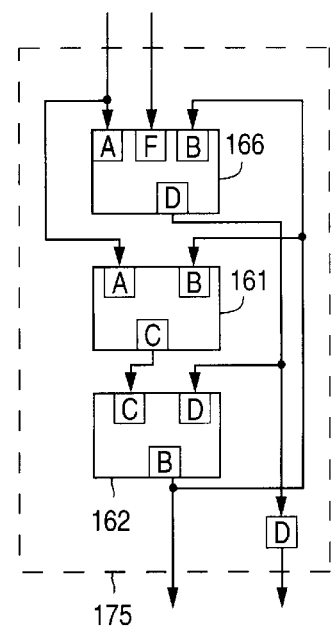

Counting step 153 of FIG. 9b is now applied to resulting non-interconnected datapath components 161, 162, and 166 in FIG. 11b. There are six different one-dimensional configurations of components 161, 162, and 166 that satisfy the interconnection requirements of step 153 for the condition in which module input ports A and F are at the top module output ports B and D are at the bottom module side. These six one-dimensional configurations are shown in FIGS. 12a–12f respectively as configurations 170–175. The interconnections of the various components and module ports through various non-redundant datapath lines are also shown in FIGS. 12a–12f.

The datapath direction in FIGS. 12a–12f extends from the top of each figure to the bottom. The datapath lines in FIGS. 12a–12f are not labeled to avoid crowding the figures. Note that certain of the datapath lines go from later datapath components in configurations 170–175 to earlier datapath components in configurations 170–175 and thus constitute feedback datapath lines.

Application of counting step 153 in FIG. 9b to configurations 170–175 leads to the following table:

| One-dim. config- uration | No. of DP lines passing comp. 161 | No. of DP lines passing comp. 162 | No. of DP lines passing comp. 166 | No. of DP lines passing all comp. |
| --- | --- | --- | --- | --- |
| 170 | 3 | 4 | 2 | 9 |
| 171 | 3 | 4 | 4 | 11 |
| 172 | 5 | 4 | 2 | 11 |
| 173 | 3 | 4 | 2 | 9 |
| 174 | 3 | 2 | 2 | 7 |
| 175 | 2 | 2 | 2 | 6 |

As an examination of this table indicates, the minimum number of instances in which a datapath line non-redundantly passes a datapath component among configurations 170–175 is six. The minimum number occurs with configuration 175. The final datapath module could be arranged in the one-dimensional sequence of configuration 175 in which component 166 precedes component 161 which precedes component 162.

A module input port can, as mentioned above, be situated along the bottom side of a datapath module instead of its top side. Likewise, a module output port can be situated along the top side of a datapath rather than its bottom side. For each condition in which one or both of module input ports A and F is located along the bottom module side and/or one or both of module output ports B and D is located along the top module side, there are six different configurations of datapath components 161, 162, and 166. Counting step 153 may be applied to all of these different configurations. The composite results are then examined to determine a one-dimensional configuration, per step 154, having the minimum count.

In configurations 170–175, all of the feedback datapath lines are shown as variously leaving certain of datapath components 161, 162, and 166 through their bottom sides and entering others of components 161, 162, and 166 through the top sides, thereby leading to at least two instances in which a feedback datapath line passes a datapath component. HDL datapath block 160 could have at least one lower level of one or more HDL datapath blocks. At least one of original datapath components 161–164 could then be a datapath module having one or more output ports situated along the top module side and/or one or more input ports situated along the bottom module side. A situation can then arise in which a feedback datapath line carries a component output signal provided from a component output port located along the top side of a datapath component and/or carries a component input signal provided to a component input port located along the bottom side of a datapath component so as to apparently avoid one or two instances in which a datapath line passes a datapath component.

Such situations are handled in one of two ways. In one alternative, the departure of a feedback datapath line through the top side of a datapath component formed with a datapath module is counted as an instance in which a datapath line passes a datapath component in applying counting step 153, the so-passed component being the one having the output port from which the feedback datapath line originates. Likewise, the entry of a feedback datapath line through the bottom side of a datapath component formed with a datapath module is counted as an instance in which a datapath line passes a datapath component in applying counting step 153, the so-passed datapath component being one having an input port at which the feedback datapath line terminates. In the other alternative, the departure of a feedback datapath line from the top side of a datapath component formed with a datapath module, or the entry of a feedback datapath line into the bottom side of a datapath component formed with a datapath module, is classified as avoiding an instance of a datapath line passing a datapath component.

Given below is an example of an HDL datapath block m005 in Verilog at the register-transfer level.

```
module m005 (DB, PB, Raddr, SImm, DACntrl, LdCntrl,
AuxRegCntrl,
    Clock, Reset, AdvCycle, MemCycle, MemCycle1,
    Save, Restore, iMMR, NDX, DMAMode, WriteAddr,
    ReadAddr, ARZ, ARTC, DW, DR);
    input   [15:0]  DB, PB;
    input   [6:0]   Raddr;
    input   [33:0]  DACntrl;
    input   [1:0]   LdCntrl;
    input   [15:0]  AuxRegCntrl;
    input   [7:0]   SImm;
    input           Clock, Reset, AdvCycle, MemCycle,
                    MemCycle1, iMMr, NDX;
    input           Save, Restore, DMAMode;
    input   [15:0]  DW;
```

```
    output  [15:0]  WriteAddr, ReadAddr, DR;
    output          ARZ, ARTC;
    wire    [15:0]  ReadAddr, WriteAddr, RdPortAddr;
    wire    [8:0]   Dp;
    reg     [2:0]   ARAddr;
    reg     [15:0]  AIB, WDMA, RDMA;
    reg     [8:0]   NextDp, Dp_C;
    wire    [15:0]  WAR, RAR;
    tri     [15:0]  DW;
    wire            ARZ, ARTC;
// Data page
always @ (LdCntrl or DACntrl or Restore or DB or PB or
    Dp_C or Dp)
    if (LdCntrl[0] | DACntrl[11]) NextDp = DB[8:0];
    else if (LdCntrl[1]) NextDp = PB[8:0];
    else if (Restore) NextDp = Dp_C;
    else NextDp = Dp;
always @(posedge Clock)
begin
    if (Save) Dp_C <= Next Dp;
end
// Auxillary block input multiplexer
always @(DACntrl or PB or DB)
    if (DACntrl [16])
        AIB = PB
    else
        AIB = DB
// Auxillary registers
m006 U1 (AIB, WriteAddr[2:0], ReadAddr[2:0], SImm,
    ARAddr, Clock, Reset, AdvCycle, MemCycle,
    MemCycle1, Save, Restore, AuxRegCntrl,
    DACntrl[32:11], iMMR, NDX, DMAMode, RAR, WAR, DW,
    DR, ARZ, ARTC);
// Read address multiplexer
always @(DACntrl or NextDp or RAR or Raddr or PB or
RdPortAddr)
begin
    if (DACntrol[1]) RDMA = RAR;
    else RDMA = {NextDp, Raddr};
.
.
.
end
endmodule
```

The ports for HDL datapath block m005 include datapath input ports DB, PB, and SImm, datapath output ports DR, WriteAddr, and ReadAddr, and input/output port DW. The datapath line minimization technique of the invention is applied to datapath block m005 to produce datapath module m005.

Figure 13:
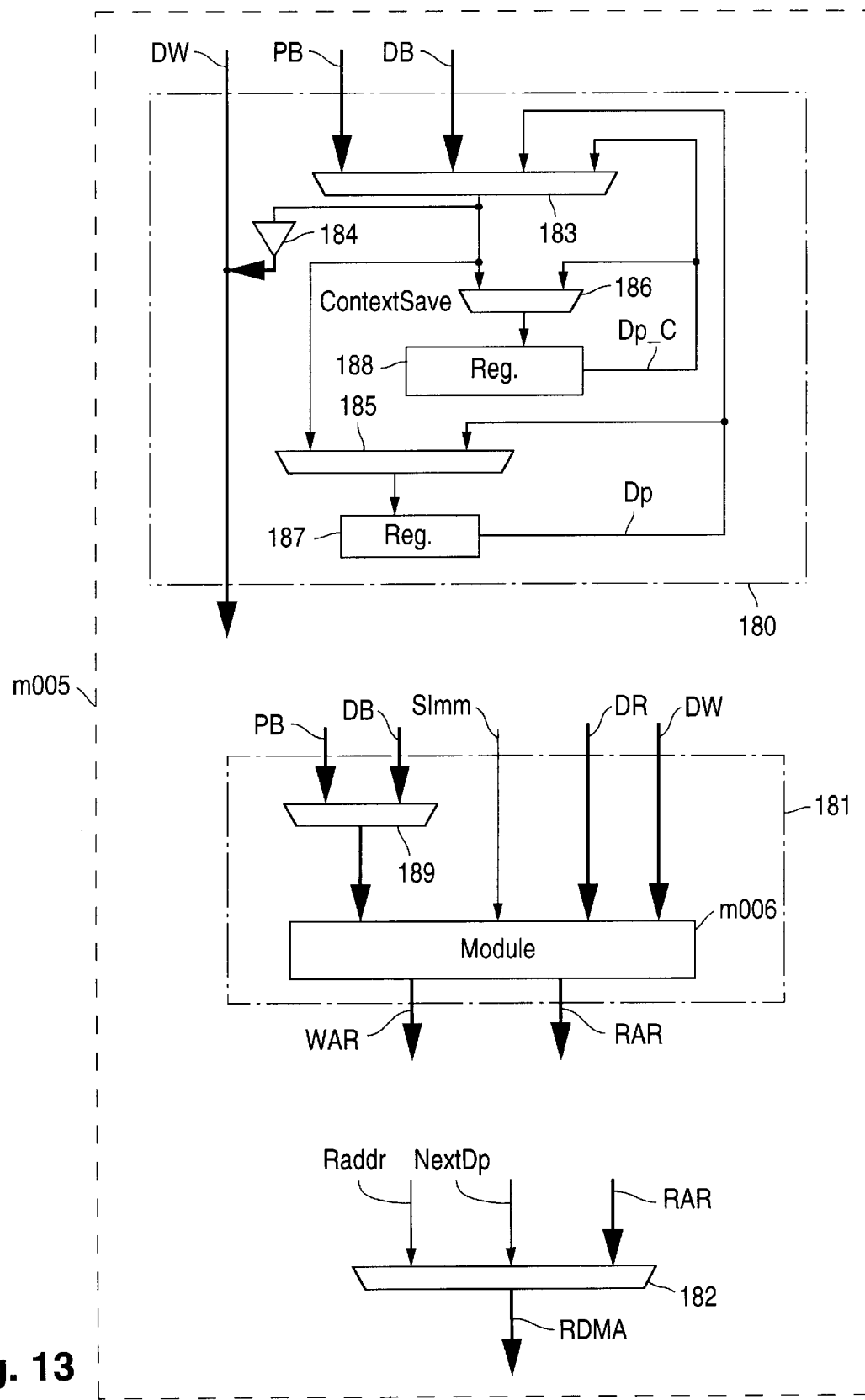
FIG. 13 is a block diagram of an exemplary datapath module whose one-dimensional datapath sequence has been determine in accordance with the invention.

FIG. 13 illustrates how HDL datapath block m005 appears after the datapath function has been translated into datapath components, and the present datapath line minimization technique has been partially performed. At the indicated point, HDL datapath block m005 contains datapath components 180–182 plus other datapath components not shown. Component 180 is a datapath group formed with multiplexer cell 183, three-state buffer cell 184, multiplexer cells 185 and 186, and register cells 187 and 188. Datapath component 181 contains datapath module m006 and multiplexer cell 189. Accordingly, component 181 is effectively a datapath module. Datapath component 182 is a multiplexer cell. An appropriate netlist (not presented here but determinable from FIG. 13) accompanies the one-dimensional floor plan of FIG. 13.

The methodology of the invention can be implemented in various ways. The present datapath line minimization technique can be performed manually. Alternatively, the datapath line minimization technique of the invention can be executed with apparatus such as a general purpose computer according to a suitable program.

Such apparatus contains circuitry for implementing the flowchart of FIG. 9 in determining how to configure multiple datapath components of an HDL datapath block into a one-dimensional datapath sequence to produce one or more datapath modules of an IC. In performing the special procedure of FIG. 9a, the apparatus contains circuitry for executing step 150, for making the decision of step 151, and for making the position assignment of step 152 along with establishing the requisite interconnections between the unique signal-matched pairs of non-interconnected datapath components that satisfy step 150. The apparatus also contains circuitry for performing counting step 153 and identifying at least one one-dimensional configuration of the datapath components for which the number of instances counted by the counting circuitry is a minimum as required for step 154.

While the invention has been described with reference to particular embodiments, this description is solely for the purpose of illustration and is not to be construed as limiting the scope of the invention claimed below. For example, the priorities for the second and third criteria utilized in the configuration-reducing procedure of FIG. 9a can be reversed. Although the circuitry to which the invention has been applied in the above examples is digital circuitry, the invention can be utilized in generating datapath floor plans for largely any type of IC, including digital ICs, analog ICs, and mixed-signal ICs that contain both digital and analog sections.

The present datapath line minimization technique, while having been indicated above as being part of structural synthesis, falls into the region in which structural synthesis transitions into physical synthesis. The datapath line minimization technique of the invention could alternatively be viewed as being part of the physical synthesis. Various modifications and applications can thus be made by those skilled in the art without departing from the true scope and spirit of the invention as defined in the appended claims.

I claim:

1. A method for configuring multiple datapath components into a one-dimensional datapath sequence extending in a datapath direction to form a datapath module that provides a specified function, multiple datapath lines extending in the datapath direction, the method comprising the steps of:

counting the number of instances in which a datapath line non-redundantly passes a datapath component in each of a plurality of different one-dimensional configurations of the datapath components for which ports of the datapath components and, as necessary, the datapath module are interconnected through datapath lines in a manner suitable to provide the specified function; and placing the datapath components in a particular one of the plurality of one-dimensional configurations for which the number of instances counted during the counting step is a minimum, subject to any timing constraint.

2. A method as in claim 1 wherein the plurality of one-dimensional configurations comprises every different one-dimensional configuration of the datapath components suitable to provide the specified function.

3. A method as in claim 1 further including, before the counting step, the steps of:

determining whether there is any instance in which an output port of one datapath component, referred to as the leading datapath component, signal-wise matches an input port of only one other datapath component, referred to as the following datapath component, provided that each of the datapath components in such a signal-matched pair has a single output port or effectively a single output port, that at least one datapath component in that signal-matched pair has a single input port, and that no interconnection through at least one datapath line is yet established between the two datapath components in that signal-matched pair;

positioning, subject to finding one such signal-matched pair of non-interconnected datapath components and subject to any timing constraint, the leading datapath component in one such signal-matched pair immediately before that pair's following datapath component in the one-dimensional datapath sequence with an interconnection now being established through at least one datapath line between the two signal-wise matched ports in that signal-matched pair of datapath components, a datapath component being formed from that signal-matched pair of so-interconnected datapath components; and repeating the determining and positioning steps, as necessary and subject to any timing constraint, until no such signal-matched pair of non-interconnected datapath components is found.

4. A method as in claim 3 wherein the positioning step is applied to any such signal-matched pair of datapath components for which each of the two datapath components has a single input port before being applied to any such signal-matched pair of datapath components for which one of the two datapath components has multiple input ports.

5. A method as in claim 1 wherein each datapath component is one bitslice wide.

6. A method as in claim 1 wherein each datapath component is a primary datapath component and, for each primary datapath component, at least one functionally corresponding further datapath component having a width of one bitslice is to be situated laterally in parallel with that primary datapath component.

7. A method for configuring multiple datapath components into a one-dimensional datapath sequence extending in a datapath direction to form a datapath module that provides a specified function in an integrated circuit, each datapath component having at least one component input port and at least one component output port, the datapath module having at least one module input port and at least one module output port, multiple datapath lines extending in the datapath direction, the method comprising the steps of:

counting the number of instances in which a datapath line non-redundantly passes a datapath component in each of a plurality of different one-dimensional configurations of the datapath components for which (a) each component output port that signal-wise matches a component input port is connected through at least one datapath line to that component input port, (b) each module input port is identical with, or is connected through at least one datapath line to, each component input port which signal-wise matches that module input port, and (c) each module output port is identical with, or is connected through at least one datapath line to, one component output port which signal-wise matches that module output port; and placing the datapath components in a particular one of the plurality of one-dimensional configurations for which the number of instances counted during the counting step is a minimum, subject to any timing constraint, with an interconnection through at least one datapath line being established for each pair of signal-wise matched component ports.

8. A method as in claim 7 wherein the plurality of one-dimensional configurations comprises every different one-dimensional configuration of the datapath components suitable to provide the specified function.

9. A method as in claim 7 wherein an instance to be counted during the counting step does not arise from a line passing a datapath component in a direction generally perpendicular to the datapath direction.

10. A method as in claim 7 wherein the datapath module has a generally rectangular periphery that includes a pair of opposing primary module sides extending generally perpendicular to the datapath direction, the module ports being situated along the primary sides.

11. A method as in claim 7 wherein each datapath component is one bitslice wide.

12. A method as in claim 11 wherein each datapath component is a primary datapath component and, for each primary datapath component, at least one functionally corresponding further datapath component having a width of one bitslice is to be situated laterally in parallel with that primary datapath component.

13. A method as in claim 7 wherein each datapath component is multiple bitslices wide.

14. A method as in claim 7 further including, before the counting step, the steps of:

determining whether there is any instance in which a component output port of one datapath component, referred to as the leading datapath component, signal-wise matches a component input port of only one other datapath component, referred to as the following datapath component, provided that each of the datapath components in such a signal-matched pair has a single component output port or effectively a single component output port, that at least one datapath component in that signal-matched pair has a single component input port, and that no interconnection through at least one datapath line is yet established between the datapath components in that signal-matched pair;

positioning, subject to finding one such signal-matched pair of non-interconnected datapath components and subject to any timing constraint, the leading datapath component in one such signal-matched pair immediately before that pair's following datapath component in the one-dimensional datapath sequence with an interconnection now being established through at least one datapath line between the two signal-wise matched component ports in that signal-matched pair of datapath components, a datapath component being formed from that signal-matched pair of so-interconnected datapath components; and repeating the determining and positioning steps, as necessary and subject to any timing constraint, until no such signal-matched pair of non-interconnected datapath components is found.

15. A method as in claim 14 wherein the positioning step is applied to any such signal-matched pair of datapath components for which each of the two datapath components has a single component input port before being applied to any such signal-matched pair of datapath components for which one of the two datapath components has multiple component input ports.

16. A method as in claim 15 wherein the positioning step is applied to any such signal-matched pair of datapath components for which the leading datapath component has multiple component input ports before being applied to any such signal-matched pair of datapath components for which the following datapath component has multiple component input ports.

17. A method as in claim 15 wherein the positioning step is applied to any such signal-matched pair of datapath components for which the following datapath component has multiple component input ports before being applied to any such signal-matched pair of datapath components for which the leading datapath component has multiple component input ports.

18. A method as in claim 14 wherein the datapath components comprise implementations of datapath cells accessible from at least one cell library, each datapath component containing at least one such implementation.

19. A method as in claim 18 wherein each datapath cell has at least one input port and a single output port or effectively a single output port.

20. A method as in claim 19 wherein each datapath cell has opposing first and second cell sides that extend generally perpendicular to the datapath direction, the second cell side being further down the one-dimensional datapath sequence than the first cell side, each input port of that datapath cell being situated along the first cell side, the output port of that datapath cell being situated along the second cell side.

21. A method as in claim 7 wherein at least one of the datapath components is a further datapath module, further including the earlier steps of configuring multiple datapath components into a one-dimensional sequence to produce each further datapath module by applying the method of claim 7 to the datapath components of each further datapath module.

22. A method as in claim 21 wherein each datapath component constituted with a datapath module has opposing first and second component sides which extend generally perpendicular to the datapath direction, the second component side being further down the one-dimensional datapath sequence than the first component side, each component port being located selectively along one of the first and second component sides.

23. A method as in claim 22 wherein any datapath line that carries a signal provided from a component output port situated along the first component side of a datapath component constituted with a datapath module, or that carries a signal provided to a component input port situated along the second component side of such a datapath component, is counted during the counting step as an instance in which a datapath line passes a datapath component.

24. A method as in claim 22 wherein any datapath line that carries a signal provided from a component output port situated along the first component side of a datapath component constituted with a datapath module, or that carries a signal provided to a component input port situated along the second component side of such a datapath component, is not counted during the counting step as an instance in which a datapath line passes a datapath component.

25. A method as in claim 7 wherein, prior to the counting step, the datapath components formed a datapath block presented in a hardware description language.

26. A method comprising the steps of:
deriving a plurality of hardware description language ("HDL") datapath blocks from an HDL description of an integrated circuit, at least one HDL datapath block being contained in at least one other HDL datapath block in a hierarchy of levels of HDL datapath blocks allocated into at least one branch, each HDL datapath block providing a specified datapath function;
translating the datapath function of each HDL datapath block into multiple datapath components configurable to form a corresponding datapath module;
configuring the datapath components of the HDL datapath blocks into a one-dimensional datapath sequence starting at the lowest level in each branch, moving upward through the levels, and using multiple datapath lines that extend in a datapath direction to interconnect the datapath components, the configuring step for each HDL datapath block comprising:
counting the number of instances in which a datapath line non-redundantly passes a datapath component in each of a plurality of different one-dimensional configurations of the datapath components in that HDL datapath block for which ports of those datapath components and, as necessary, the corresponding datapath module are interconnected through datapath lines in a manner suitable to provide the datapath function for that HDL datapath block; and
placing the datapath components in that HDL datapath block in a particular one of the plurality of one-dimensional configurations for which the number of instances counted during the counting step is a minimum, subject to any timing constraint.

27. A method as in claim 26 wherein the plurality of configurations for each HDL datapath block comprises every different one-dimensional configuration for which the datapath components in that HDL datapath block provide its datapath function.

28. A method as in claim 26 further including for each HDL datapath block, before the counting step for each HDL datapath block, the steps of:
determining for that HDL datapath block whether there is any instance in which an output port of one datapath component, referred to as the leading datapath component, signal-wise matches an input port of only one other datapath component, referred to as the following datapath component, provided that each of the datapath components in such a signal-matched pair has a single output port or effectively a single output port, that at least one datapath component in that signal-matched pair has a single input port, and that no interconnection through at least one datapath line is yet established between the two datapath components in that signal-matched pair;
positioning, subject to finding one such signal-matched pair of non-interconnected datapath components in that HDL datapath block and subject to any timing constraint, the leading datapath component in one such signal-matched pair immediately before that pair's following datapath component in the one-dimensional datapath sequence with an interconnection now being established through at least one datapath line between the two signal-matched ports in that signal-matched pair of datapath components, a datapath component being formed from that signal-matched pair of so-interconnected datapath components; and
repeating the determining and positioning steps, as necessary and subject to any timing constraint, until no such signal-matched pair of non-interconnected datapath components is found in that HDL datapath block.

29. A method as in claim 28 wherein the datapath components comprise implementations of datapath cells accessible from at least one cell library, each datapath component at the lowest level in each branch being formed with one implementation of one of the datapath cells when the determining step is first performed at the lowest level in each branch.

30. A method as in claim 26 wherein the datapath components of each HDL datapath block above the lowest level in each branch further include at least one datapath module created from at least one other HDL datapath block.

31. A method as in claim 30 wherein each datapath component constituted with a datapath module has opposing first and second component sides which extend generally perpendicular to the datapath direction, the second component side being further down the one-dimensional datapath sequence than the first component side, each input or output port of that datapath component being located selectively along one of the first and second component sides.

32. A method as in claim 31 wherein any feedback datapath line that carries a signal provided from an output port situated along the first component side of a datapath component constituted with a datapath module is counted during the counting step as an instance in which a datapath line passes a datapath component.

33. A method as in claim 31 wherein any feedback datapath line that carries a signal provided from an output port situated along the first component side of a datapath component constituted with a datapath module is not counted during the counting step as an instance in which a datapath line passes a datapath component.

34. A method as in claim 31 wherein any feedback datapath line that carries a signal provided to an input port situated along the second component side of a datapath component constituted with a datapath module is counted during the counting step as an instance in which a datapath line passes a datapath component.

35. A method as in claim 31 wherein any feedback datapath line that carries a signal provided to an input port situated along the second component side of a datapath component constituted with a datapath module is not counted during the counting step as an instance in which a datapath line passes a datapath component.

36. Apparatus for determining how to configure multiple datapath components into a one-dimensional datapath sequence extending in a datapath direction to form a datapath module that provides a specified function, multiple datapath lines extending in the datapath direction, the apparatus comprising:
    means for counting the number of instances in which a datapath line non-redundantly passes a datapath component in each of a plurality of different one-dimensional configurations of the datapath components for which ports of the datapath components and, as necessary, the datapath module are interconnected through datapath lines in a manner suitable to provide the specified function; and
    means for identifying at least one of the plurality of one-dimensional configurations for which the number of instances counted by the counting means is a minimum, subject to any timing constraint.

37. Apparatus as in claim 36 wherein the plurality of configurations comprises every different one-dimensional configuration of the datapath components suitable to provide the specified function.

38. Apparatus as in claim 36 further including:
    means for determining whether there is any instance in which an output port of one datapath component, referred to as the leading datapath component, signal-wise matches an input port of only one other datapath component, referred to as the following datapath component, provided that each of the datapath components in such a signal-matched pair has a single output port or effectively a single output port, that at least one datapath component in that signal-matched pair has a single input port, and that no interconnection through at least one datapath line is yet established between the datapath components in that signal-matched pair; and
    means, subject to finding at least one such signal-matched pair of non-interconnected datapath components and subject to any timing constraint, for assigning the leading datapath component in one such signal-matched pair to a position immediately before that pair's following datapath component in the one-dimensional datapath sequence with an interconnection being established through at least one datapath line between the two signal-wise matched ports in that signal-matched pair of datapath components, a datapath component being formed from that signal-matched pair of so-interconnected datapath components.

39. Apparatus as in claim 36 wherein each datapath component is one bitslice wide.

40. Apparatus as in claim 39 wherein each datapath component is a primary datapath component and, for each primary datapath component, at least one functionally corresponding further datapath component having a width of one bitslice is to be situated laterally in parallel with that primary datapath component.

41. Apparatus as in claim 36 wherein the datapath components comprise implementations of datapath cells accessible from at least one cell library, each datapath component containing at least one such implementation.

42. Apparatus for determining how to configure multiple datapath components into a one-dimensional datapath sequence extending in a datapath direction to form a datapath module that provides a specified function in an integrated circuit, each datapath component having at least one component input port and at least one component output port, the datapath module having at least one module input port and at least one module output port, multiple datapath lines extending in the datapath direction, the apparatus comprising:
    means for counting the number of instances in which a datapath line non-redundantly passes a datapath component in each of a plurality of different one-dimensional configurations of the datapath components for which (a) each component output port that signal-wise matches a component input port is connected through at least one datapath line to that component input port, (b) each module input port is identical with, or is connected through at least one datapath line to, each component input port which signal-wise matches that module input port, and (c) each module output port is identical with, or is connected through at least one datapath line to, one component output port which signal-wise matches that module output port; and
    means for identifying at least one of the plurality of one-dimensional configurations for which the number of instances counted by the counting means is a minimum, subject to any timing constraint, with an interconnection through at least one datapath line being established for each pair of signal-wise matched component ports.

43. Apparatus as in claim 42 wherein the plurality of configurations comprises every different one-dimensional configuration of the datapath components suitable to provide the specified function.

44. Apparatus as in claim 42 further including:
    means for determining whether there is any instance in which a component output port of one datapath component, referred to as the leading datapath component, signal-wise matches a component input port of only one other datapath component, referred to as the following datapath component, provided that each of the datapath components in such a signal-matched pair has a single output port or effectively a single output port, that at least one datapath component in that signal-matched pair has a single component input port, and that no interconnection through at least one datapath line is yet established between the two datapath components in that signal-matched pair; and means, subject to finding at least one such signal-matched pair of non-interconnected datapath components and subject to any timing constraint, for assigning the leading datapath component in one such signal-matched pair to a position immediately before that pair's following datapath component in the one-dimensional datapath sequence with an interconnection being established through at least one datapath line between the two signal-wise matched component ports in that signal-matched pair of datapath components, a datapath group that constitutes a datapath component being formed from that signal-matched pair of so-interconnected datapath components.

45. Apparatus as in claim 44 wherein the assigning means performs the position assignment on any such signal-matched pair of datapath components for which each of the two datapath components has a single component input port before performing the position assignment on any such signal-matched pair of datapath components for which one of the two datapath components has multiple component input ports.

46. A method as in claim 4 wherein the positioning step is applied to any such signal-matched pair of datapath components for which the leading datapath component has multiple input ports before being applied to any such signal-matched pair of datapath components for which the following datapath component has multiple input ports.

47. A method as in claim 4 wherein the positioning step is applied to any such signal-matched pair of datapath components for which the following datapath component has multiple input ports before being applied to any such signal-matched pair of datapath components for which the leading datapath component has multiple input ports.

48. A method as in claim 28 wherein the positioning step for each HDL datapath block is applied to any such signal-matched pair of datapath components for which each of the two datapath components has a single input port before being applied to any such signal-matched pair of datapath components for which one of the two datapath components has multiple input ports.

49. A method as in claim 48 wherein the positioning step for each HDL datapath block is applied to any such signal-matched pair of datapath components for which the leading datapath component has multiple input ports before being applied to any such signal-matched pair of datapath components for which the following datapath component has multiple input ports.

50. A method as in claim 48 wherein the positioning step for each HDL datapath block is applied to any such signal-matched pair of datapath components for which the following datapath component has multiple input ports before being applied to any such signal-matched pair of datapath components for which the leading datapath component has multiple input ports.

51. Apparatus as in claim 38 wherein the assigning means performs the position assignment on any such signal-matched pair of datapath components for which each of the two datapath components has a single input port before performing the position assignment on any such signal-matched pair of datapath components for which one of the two datapath components has multiple input ports.

52. Apparatus as in claim 51 wherein the assigning means performs the position assignment on any such signal-matched pair of datapath components for which the leading datapath component has multiple input ports before performing the position assignment on any such signal-matched pair of datapath components for which the following datapath component has multiple input ports.

53. Apparatus as in claim 51 wherein the assigning means performs the position assignment on any such signal-matched pair of datapath components for which the following datapath component has multiple input ports before performing the position assignment on any such signal-matched pair of datapath components for which the leading datapath component has multiple input ports.

54. Apparatus as in claim 41 wherein each datapath cell has at least one input port and a single output port or effectively a single output port.

55. Apparatus method as in claim 45 wherein the assigning means performs the position assignment on any such signal-matched pair of datapath components for which the leading datapath component has multiple component input ports before performing the position assignment on any such signal-matched pair of datapath components for which the following datapath component has multiple component input ports.

56. Apparatus as in claim 45 wherein the assigning means performs the position assignment on any such signal-matched pair of datapath components for which the following datapath component has multiple component input ports before performing the position assignment on any such signal-matched pair of datapath components for which the leading datapath component has multiple component input ports.

* * * * *